(12) United States Patent
Fujiwara et al.

(10) Patent No.: US 12,260,904 B2
(45) Date of Patent: *Mar. 25, 2025

(54) MEMORY DEVICE WITH ADDITIONAL WRITE BIT LINES

(71) Applicant: Taiwan Semiconductor Manufacturing Company, Ltd., Hsinchu (TW)

(72) Inventors: Hidehiro Fujiwara, Hsinchu (TW); Chia-En Huang, Hsinchu (TW); Yen-Huei Chen, Hsinchu (TW); Jui-Che Tsai, Tainan (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/066,306

(22) Filed: Dec. 15, 2022

(65) Prior Publication Data

US 2023/0118295 A1  Apr. 20, 2023

Related U.S. Application Data

(63) Continuation of application No. 16/870,030, filed on May 8, 2020, now Pat. No. 11,532,351.

(51) Int. Cl.
*G11C 11/419* (2006.01)
*G11C 7/12* (2006.01)

(52) U.S. Cl.
CPC .............. *G11C 11/419* (2013.01); *G11C 7/12* (2013.01)

(58) Field of Classification Search
CPC ........ G11C 11/419; G11C 11/413; G11C 7/12

USPC .......................................... 365/203
See application file for complete search history.

(56) References Cited

U.S. PATENT DOCUMENTS

| 6,212,109 B1 | 4/2001 | Proebsting |
| 6,356,485 B1 | 3/2002 | Proebsting |
| 6,625,070 B2 | 9/2003 | Ueno et al. |
| 6,967,882 B1 * | 11/2005 | Akiyoshi ............. G11C 7/1006 365/201 |
| 10,878,890 B1 | 12/2020 | Chen et al. |
| 2001/0010654 A1 * | 8/2001 | Shau .................... G11C 11/4096 257/E27.092 |
| 2005/0174867 A1 | 8/2005 | Kang |
| 2005/0207242 A1 * | 9/2005 | Yabe ........................ G11C 7/18 365/200 |

(Continued)

FOREIGN PATENT DOCUMENTS

CN     107424645 A    12/2017

OTHER PUBLICATIONS

Kiyoo Itoh, "VLSI Memory Chip Design," Springer-Verlag Berlin Heidelberg New York, Chapter 3.6 pp. 141-174 and Chapter 7.5 pp. 413-423 (2001).

*Primary Examiner* — Sung Il Cho
(74) *Attorney, Agent, or Firm* — Merchant & Gould P.C.

(57) ABSTRACT

A memory device is provided. The memory device includes a plurality of memory cells arranged in a matrix of a plurality of rows and a plurality of columns. A first column of the plurality of columns of the matrix includes a first plurality of memory cells of the plurality of memory cells, a first pair of bit lines connected to each of the first plurality of bit cells, and a second pair of bit lines connectable to the first pair of bit lines through a plurality of switches.

20 Claims, 8 Drawing Sheets

(56) References Cited

U.S. PATENT DOCUMENTS

| | | | |
|---|---|---|---|
| 2012/0206988 A1* | 8/2012 | Song | G11C 7/12 |
| | | | 365/189.011 |
| 2013/0039120 A1* | 2/2013 | Moriwaki | G11C 11/419 |
| | | | 365/154 |
| 2014/0071745 A1* | 3/2014 | Kawasumi | G11C 7/062 |
| | | | 365/158 |
| 2017/0345485 A1 | 11/2017 | Sinangil et al. | |
| 2018/0240513 A1 | 8/2018 | Sano et al. | |
| 2019/0066773 A1 | 2/2019 | Park et al. | |
| 2020/0327924 A1* | 10/2020 | Cosemans | G11C 11/4087 |

* cited by examiner

MEMORY DEVICE WITH ADDITIONAL WRITE BIT LINES

CROSS-REFERENCE TO RELATED APPLICATION

This application is a continuation of U.S. patent application Ser. No. 16/870,030 filed May 8, 2020, now U.S. Pat. No. 11,532,351, the disclosure of which is hereby incorporation herein by reference in its entirety.

BACKGROUND

A common type of integrated circuit memory is a static random access memory (SRAM) device. An SRAM device includes an array of memory cells. Each memory cell uses a predetermined number of transistors connected between an upper reference potential and a lower reference potential such that one of two storage nodes are occupied by the information to be stored, with the complementary information stored at the other storage node. In one example, an SRAM memory cell arrangement includes six transistors. Each bit in the SRAM cell is stored on four of the six transistors, which transistors form cross-coupled inverters. The remaining two transistors are connected to a word line which controls access to the memory cell during read and write operations by selectively connecting the memory cell to bit lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
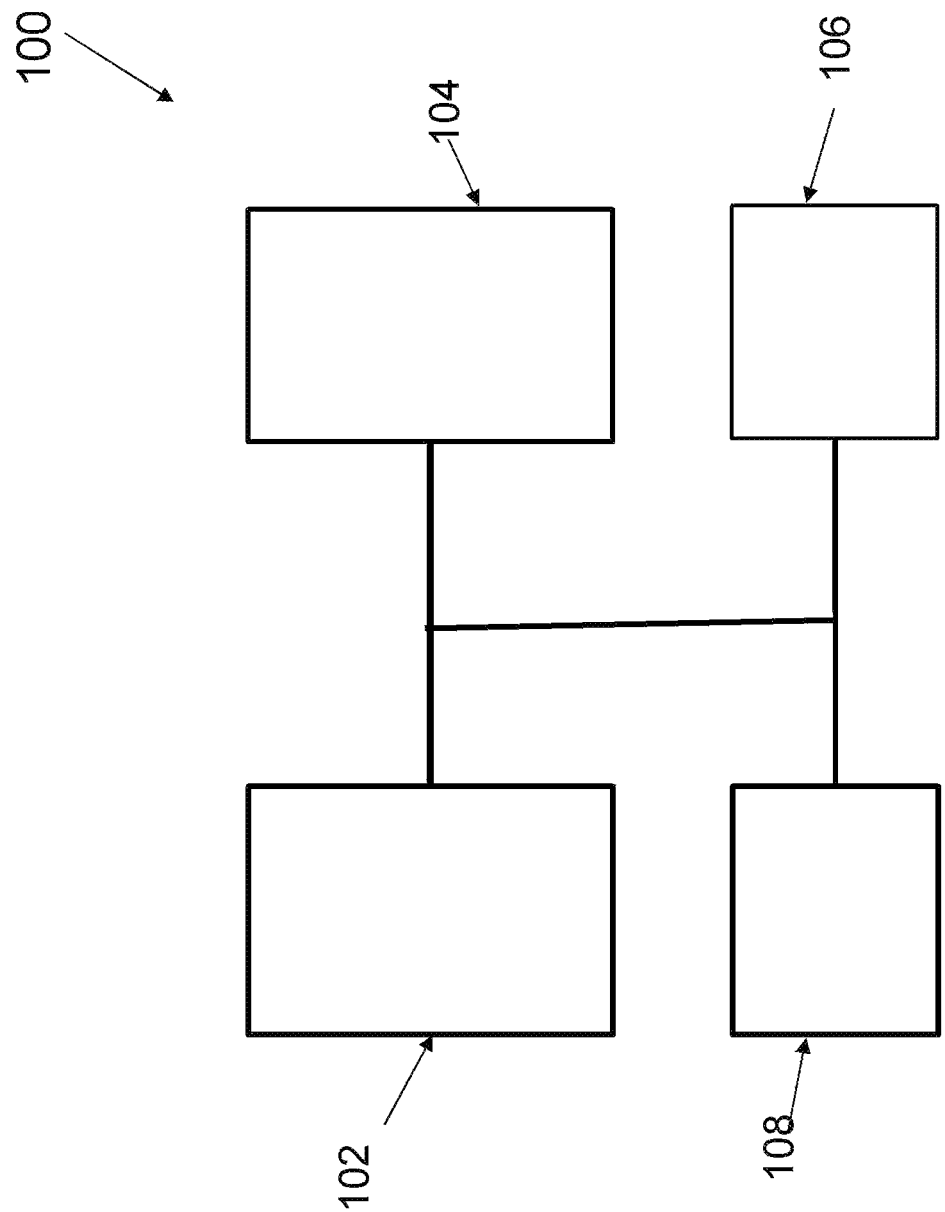
FIG. 1 is a diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some disclosed examples, a memory device with an additional pair of bit lines is provided. More specifically, a static random access memory (SRAM) device with additional bit line pairs to improve a performance of the SRAM device during write operations is provided. The additional bit line pairs are selectively connectable to existing bit line pairs for the write operation. This, as explained in the following sections of the disclosure, increases the performance of the memory device for the write operation. In some embodiments, the additional bit line pairs are formed in a different metal layer than that of the existing bit line pairs. For example, the additional bit line pairs are formed in a higher metal layer than that of the existing bit line pairs. That is, if the existing bit line pairs are formed in metal layer 1 then the additional bit line pairs are formed in metal layer 2 or above.

FIG. 1 is a diagram illustrating an example memory device 100 in accordance with some embodiments. As shown in FIG. 1, memory device 100 includes a word line driver circuit 102, a cell array 104, a multiplexer 106, and a write driver circuit 108. However, it will be apparent to a person with the ordinary skill in the art after reading this disclosure that memory device 100 can include additional components not shown in FIG. 1. For example, memory device 100 can include a pre-charge circuit, a read select circuit, a write select circuit, etc.

Cell array 104 includes a plurality of cells (also referred to as bit cells or memory cells) arranged in a matrix of rows and columns. Each of the plurality of memory cells are operative to store one bit of information (that is, a bit value 0 or a bit value 1). In addition, cell array 104 includes a plurality of word lines, a plurality of bit line pairs, and a plurality of additional bit line pairs (not shown). Each cell of cell array 104 is connected to a word line and a bit line pair for a read operation and a word line, a bit line pair, and an additional bit line pair for a write operation.

Word line driver circuit 102 is operative to select a word line of cell array 104 and charge the selected word line to a logic high for a read operation or a write operation. In example embodiments, word line driver circuit 120 is a decoder circuit which includes a plurality of logic operators to decode potentials on address lines to select a word line to charge. The address lines are charged to a logic high (that is, approximately equal to a first predefined potential) or a logic low (that is, approximately equal to a second predefined potential). The first predefined potential is approximately equal to a supply voltage (that is, VDD). The second predefined potential is approximately equal to the ground voltage or zero volts. However, other suitable logic low and logic high voltages may be employed. A logic high is represented by bit value 1 and a logic low is represented by bit value 0.

Multiplexer 106 is operative to select a column of cell array 104 and pre-charge a bit line pair associated with the selected column to a predetermined voltage for a read operation. In addition, multiplexer 106 is operative to select a column of cell array 104 and pre-charge both a bit line pair and an additional bit line pair associated with the selected column to a predetermined voltage for a write operation. Write driver circuit 108 is operative to write one bit of information to one or more bit cells connected to the selected one of the plurality of word lines and the selected bit line pair of the plurality of bit line pairs.

Figure 2:
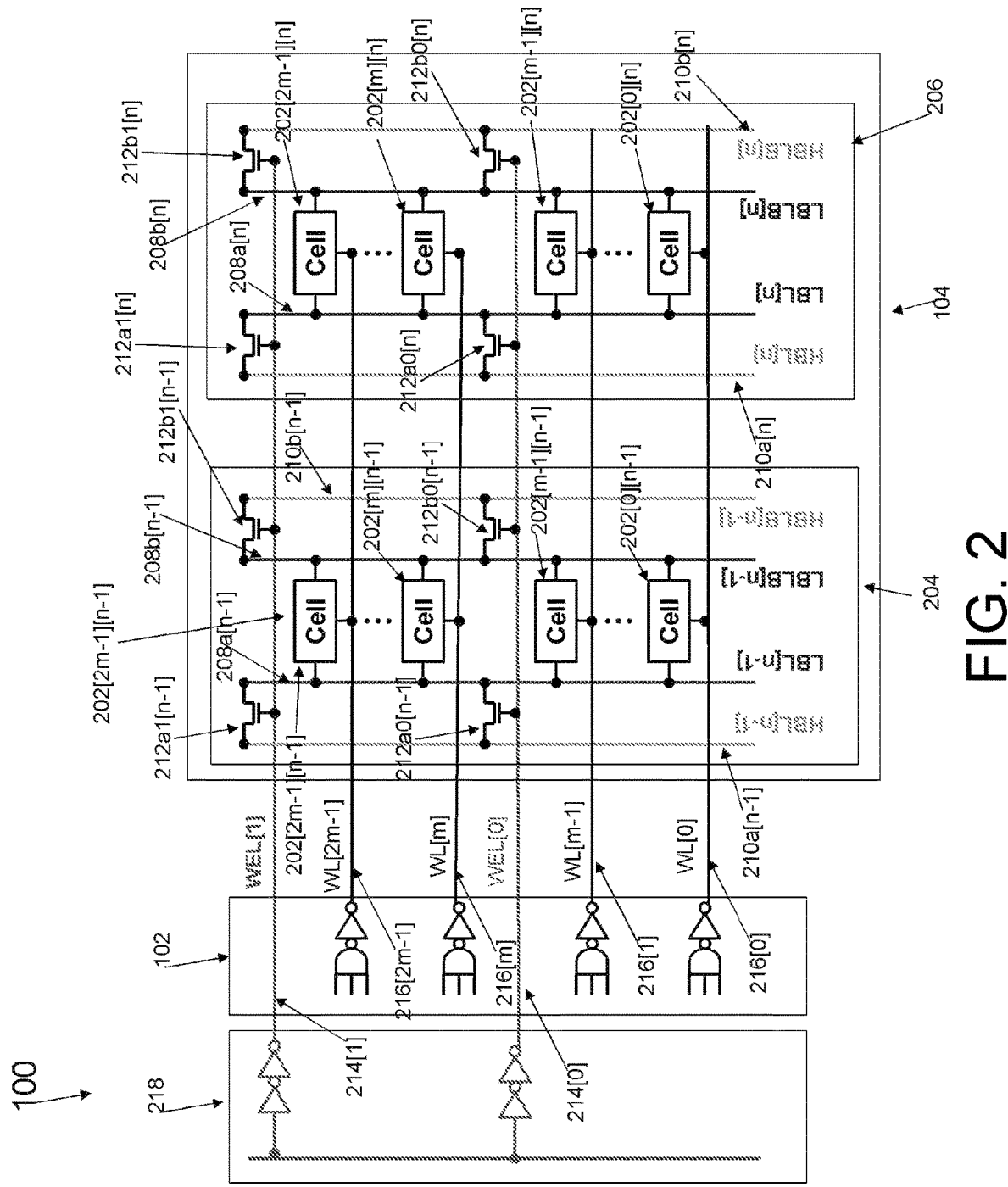
FIG. 2 is a diagram of an example memory device illustrating an example cell array, in accordance with some embodiments.

FIG. 2 is a diagram of example memory device 100 illustrating cell array 104 in greater detail in accordance with some embodiments. As shown in FIG. 2, cell array 104 includes a plurality of cells, for example, cell 202[0][n−1], . . . , cell 202[$m$−1][n−1], cell 202[$m$][$n$−1], cell 202[2m−1][n−1], cell 202[0][n], . . . , cell 202[$m$−1][n], cell 202[$m$][$n$], . . . , and cell 202[2m−1][n]. An example cell of the plurality of cells includes a pair of cross-coupled inverters (also referred to as Q and Q-bar, where Q-bar is complementary to Q) to store the one bit of information. The cross coupled inverters are connected to pair of access transistors which grant access to the information stored in the cross-coupled inverters. In example embodiments, the plurality of cells of cell array 104 are formed using four transistors, six transistors, or eight transistors. In addition, the plurality of cells of cell array 104 are a single port cell or a multi-port (such as, a dual port and a three port) cell.

The plurality of cells are arranged in a matrix of a plurality of columns and a plurality of rows. For example, a first plurality of cells labeled as 202[0][n−1], . . . , 202[$m$−1][n−1], 202[$m$][$n$−1] 202[2m−1][n−1] are arranged in a [n−1]th column 204. In addition, another first plurality of cells labeled as 202[0][n], 202[$m$−1][n], 202[$m$][$n$], 202 [2m−1][n] are arranged in a [n]th column 206. Although, cell array 104 is shown to include only two columns, that is, [n−1]th column 204 and [n]th column 206, it will be apparent to a person with an ordinary skill in the art after reading this disclosure that cell array 104 may include a different number of columns. For example, cell array 104 can include 32, 64, 128, 256, 512, or 1024 columns.

Continuing with FIG. 2, a second plurality of cells labeled as 202[0][n−1] and 202[0][n] are arranged in a [0]th row. In addition, another second plurality of cells labeled as 202 [$m$−1][n−1] and 202[$m$−1][n] are arranged in [m−1]th row. Similarly, yet another second plurality of cells labeled as 202[$m$][$n$−1] and 202[$m$][$n$] are arranged in [m]th row continuing to yet another second plurality of cells labeled as 202[2m−1][n−1] and 202[2m−1][n] which are arranged in a [2m−1]th row of cell array 104. It will be apparent to a person with ordinary skill in the art after reading this disclosure that cell array 104 includes a predetermined number of rows. For example, cell array 104 may include 32, 64, 128, 256, 512, or 1024 rows.

Each cell of a row of the plurality of rows is connected to a word line WL. For example, and as shown in FIG. 2, cell 202[0][n−1] and cell 202[0][n] of [0]th row are connected to a [0]th word line WL[0] 216[0]. In addition, cell 202[$m$−1] [n−1] and cell 202[$m$−1][n] of [m−1]th row are connected to a [m−1]th word line WL[m−1] 216[$m$−1]. Similarly, cell 202[$m$][$n$−1] and cell 202[$m$][$n$] of [m]th row are connected to a [m]th word line WL[m] 216[$m$] continuing to cell 202[2m−1][n−1] and cell 202[2m−1][n] of [2m−1]th row which are connected to a [2m−1]th word line WL[2m−1] 216[$m$−1].

Moreover, each cell of a column of the plurality of columns is connected to a bit line pair (that is, a bit line and a complementary bit line, also referred to as a lower bit line LBL and a lower bit line bar LBLB respectively). For example, the first plurality of cells of [n−1]th column 204 are associated with and connectable to an [n−1]th bit line pair. That is, first plurality of cells labeled as 202[0][n−1], 202[$m$−1][n−1], 202[$m$][$n$−1], 202[2m−1][n−1] arranged in [n−1]th column 204 are associated with and connectable to a [n−1]th bit line LBL[n−1] 208$a$[$n$−1] and a [n−1]th complementary bit line LBLB[n−1] 208$b$[$n$−1]. Similarly, the first plurality of cells of [n]th column 206 are associated with and connectable to an [n]th bit line pair. That is, another first plurality cells labeled as 202[0][n], . . . , 202[$m$−1][n], 202[$m$][$n$], . . . , 202[2m−1][n] and arranged in [n]th column 206 are associated with and connectable to [n]th bit line LBL[n] 208$a$[$n$] and a [n]th complementary bit line LBLB [n] 208$b$[$n$].

In addition, and shown in FIG. 2, each bit line pair of cell array 104 is associated with and is connectable to an additional bit line pair (that is, an additional bit line and an additional complementary bit line, also referred to as a higher bit line HBL and a higher bit line bar HBLB respectively). For example, [n−1]th bit line pair is associated with and is connectable to [n−1]th additional bit line pair. More specifically, a [n−1]th bit line LBL[n−1] 208$a$[$n$−1] of [n−1]th bit line pair is associated with and is connectable to a [n−1]th additional bit line HBL[n−1] 210$a$[$n$−1] of [n−1]th additional bit line pair. Similarly, a [n−1]th complementary bit line LBLB[n−1] 208$b$[$n$−1] of [n−1]th bit line pair is associated with and connectable to a [n−1]th additional complementary bit line HBLB[n−1] 210$b$[$n$−1] of [n−1]th additional bit line pair.

Moreover, [n]th bit line pair is associated with and is connectable [n]th additional bit line pair. More specifically, a [n]th bit line LBL[n] 208$a$[$n$] of [n]th bit line pair is associated with and connectable to a [n]th additional bit line HBL[n] 210$a$[$n$] of [n]th additional bit line pair. Similarly, a [n]th complementary bit line LBLB[n] 208$b$[$n$] of [n]th bit line pair is associated with and connectable to a [n]th additional complementary bit line HBLB[n] 210$b$[$n$] of [n]th additional bit line pair.

In example embodiments, [n−1]th bit line LBL[n−1] 208$a$[$n$−1] of [n−1]th bit line pair is connectable to [n−1]th additional bit line HBL[n−1] 210$a$[$n$−1] of [n−1]th additional bit line pair through a plurality of [n−1]th switches. In other embodiments, [n−1]th bit line LBL[n−1] 208$a$[$n$−1] of [n−1]th bit line pair is connectable to [n−1]th additional bit line HBL[n−1] 210$a$[$n$−1] of [n−1]th additional bit line pair through a switch after every m rows, where m is predetermined. For example, [n−1]th bit line LBL[n−1] 208$a$[$n$−1] of [n−1]th bit line pair is connectable to [n−1]th additional bit line HBL[n−1] 210$a$[$n$−1] of [n−1]th additional bit line pair through a [n−1]th first switch 212$a$0[$n$−1] after first m rows (that is, after row numbers [0] to [m−1]) and through a [n−1]th second switch 212$a$1[$n$−1] after next m rows (that is, after row numbers [m] to [2m−1]). In example embodiments, m rows includes between 16 rows and 256 rows.

[n−1]th bit line LBL[n−1] 208a[n−1] of [n−1]th bit line pair is connected to [n−1]th additional bit line HBL[n−1] 210a[n−1] of [n−1]th additional bit line pair when one or more of the plurality of [n−1]th switches are switched ON. For example, [n−1]th bit line LBL[n−1] 208a[n−1] of [n−1]th bit line pair is connected to [n−1]th additional bit line HBL[n−1] 210a[n−1] of [n−1]th additional bit line pair when one or both of [n−1]th first switch 212a0[n−1] and [n−1]th second switch 212a1[n−1] are switched ON. By extension, [n−1]th bit line LBL[n−1] 208a[n−1] of [n−1]th bit line pair is disconnected from [n−1]th additional bit line HBL[n−1] 210a[n−1] of [n−1]th additional bit line pair when both of [n−1]th first switch 212a0[n−1] and [n−1]th second switch 212a1[n−1] are switched OFF.

In example embodiments, each of [n−1]th first switch 212a0[n−1] and [n−1]th second switch 212a1[n−1] is a n-channel metal oxide semiconductor (nMOS) transistor. However, other types transistors, for example, a metal oxide semiconductor field effect transistor (MOSFET), a p-channel metal oxide semiconductor (pMOS) transistor, a complementary metal oxide semiconductor (CMOS) transistor, etc., are within the scope of the disclosure. A source of each of [n−1]th first switch 212a0[n−1] and [n−1]th second switch 212a1[n−1] is connected to [n−1]th bit line LBL[n−1] 208a[n−1] and a drain of each of [n−1]th first switch 212a0[n−1] and [n−1]th second switch 212a1[n−1] is connected to [n−1]th additional bit line HBL[n−1] 210a[n−1]. However, each of [n−1]th first switch 212a0[n−1] and [n−1]th second switch 212a1[n−1] is symmetrical. Hence, a source of each of [n−1]th first switch 212a0[n−1] and [n−1]th second switch 212a1[n−1] can be a drain and a drain can be a source.

Similarly, [n−1]th complementary bit line LBLB[n−1] 208b[n−1] of [n−1]th bit line pair is connectable to [n−1]th additional complementary bit line HBLB[n−1] 210b[n−1] of [n−1]th additional bit line pair through a plurality of [n−1]th complementary switches. In example embodiments, [n−1]th complementary bit line LBLB[n−1] 208b[n−1] of [n−1]th bit line pair is connectable to [n−1]th additional complementary bit line HBLB[n−1] 210b[n−1] of [n−1]th additional bit line pair through a switch after every m rows, where m is predetermined. For example, [n−1]th complementary bit line LBLB[n−1] 208b[n−1] of [n−1]th bit line pair is connectable to [n−1]th additional complementary bit line HBLB[n−1] 210b[n−1] of [n−1]th additional bit line pair through [n−1]th first complementary switch 212b0[n−1] after first m rows (that is, after row number [0] to [m−1]) and through [n−1]th second complementary switch 212b1[n−1] after next m rows (that is, after row numbers [m] to [2m−1]). In example embodiments, m rows includes between 16 rows and 256 rows.

[n−1]th complementary bit line LBLB[n−1] 208b[n−1] of [n−1]th bit line pair is connected to [n−1]th additional complementary bit line HBLB[n−1] 210b[n−1] of [n−1]th additional bit line pair when one or more of the plurality of [n−1]th complementary switches are switched ON. For example, [n−1]th complementary bit line LBLB[n−1] 208b[n−1] of [n−1]th bit line pair is connected to [n−1]th additional complementary bit line HBLB[n−1] 210b[n−1] of [n−1]th additional bit line pair when one or both of [n−1]th first complementary switch 212b0[n−1] and [n−1]th second complementary switch 212b1[n−1] are switched ON. By extension, [n−1]th complementary bit line LBLB[n−1] 208b[n−1] of [n−1]th bit line pair is disconnected from [n−1]th additional complementary bit line HBLB[n−1] 210b[n−1] of [n−1]th additional bit line pair when both of [n−1]th first complementary switch 212b0[n−1] and [n−1]th second complementary switch 212b1[n−1] are switched OFF.

In example embodiments, each of [n−1]th first complementary switch 212b0[n−1] and [n−1]th second complementary switch 212b1[n−1] is a n-channel metal oxide semiconductor (nMOS) transistor. However, other types of transistors, for example, a MOSFET, a pMOS transistor, a CMOS transistor, etc., are within the scope of the disclosure. A source of each of [n−1]th first complementary switch 212b0[n−1] and [n−1]th second complementary switch 212b1[n−1] is connected to [n−1]th complementary bit line LBLB[n−1] 208b[n−1] and a drain of each of [n−1]th first complementary switch 212b0[n−1] and [n−1]th second complementary switch 212b1[n−1] is connected to [n−1]th additional complementary bit line HBLB[n−1] 210b[n−1]. However, each of [n−1]th first complementary switch 212b0[n−1] and [n−1]th second complementary switch 212b1[n−1] is symmetrical. Hence, a source of each of [n−1]th first complementary switch 212b0[n−1] and [n−1]th second complementary switch 212b1[n−1] can be a drain and a drain can be a source.

In addition, [n]th bit line of [n]th bit line pair is connectable to [n]th additional bit line of [n]th additional bit line pair through a plurality of [n]th switches. In example embodiments, [n]th bit line LBL[n] 208a[n] of [n]th bit line pair is connectable to [n]th additional bit line HBL[n] 210a[n] of [n]th additional bit line pair through a switch after every m rows, where m is predetermined. For example, [n]th bit line LBL[n] 208a[n] of [n]th bit line pair is connectable to [n]th additional bit line HBL[n] 210a[n] of [n]th additional bit line pair through a [n]th first switch 212a0[n] after first m rows (that is, after row numbers [0] to [m−1]) and through a [n]th second switch 212a1[n] after second m rows (that is, after row numbers [m] to [2m−1]). In example embodiments, m rows includes between 16 rows and 256 rows.

[n]th bit line LBL[n] 208a[n] of [n]th bit line pair is connected to [n]th additional bit line HBL[n] 210a[n] of [n]th additional bit line pair when one or more of the plurality of [n]th switches are switched ON. For example, [n]th bit line LBL[n] 208a[n] of [n]th bit line pair is connected to [n]th additional bit line HBL[n] 210a[n] of [n]th additional bit line pair when one or both of [n]th first switch 212a0[n] and [n]th second switch 212a1[n] are switched ON. By extension, [n]th bit line LBL[n] 208a[n] of [n]th bit line pair is disconnected from [n]th additional bit line HBL[n] 210a[n] of [n]th additional bit line pair when both of [n]th first switch 212a0[n] and [n]th second switch 212a1[n] are switched OFF.

In example embodiments, each of [n]th first switch 212a0[n] and [n]th second switch 212a1[n] is a n-channel metal oxide semiconductor (nMOS) transistor. However, other types of transistors, for example, a MOSFET, a pMOS transistor, a CMOS transistor, etc., are within the scope of the disclosure. A source of each of [n]th first switch 212a0[n] and [n]th second switch 212a1[n] is connected to [n]th bit line LBL[n] 208a[n] and a drain of each of [n]th first switch 212a0[n] and [n]th second switch 212a1[n] is connected to [n]th additional bit line HBL[n] 210a[n]. However, each of [n]th first switch 212a0[n] and [n]th second switch 212a1[n] is symmetrical. Hence, a source of each of [n]th first switch 212a0[n] and [n]th second switch 212a1[n] can be a drain and a drain can be a source.

Moreover, [n]th complementary bit line LBLB[n] 208b[n] of [n]th bit line pair is connectable to [n]th additional complementary bit line HBLB[n] 210b[n] of [n]th additional bit line pair through a plurality of complementary switches.

In example embodiments, [n]th complementary bit line LBLB[n] 208b[n] of [n]th bit line pair is connectable to [n]th additional complementary bit line HBLB[n] 210b[n] of [n]th additional bit line pair through a switch after every [m]th row, where m is predetermined. For example, [n]th complementary bit line LBLB[n] 208b[n] of [n]th bit line pair is connectable to [n]th additional complementary bit line HBLB[n] 210b[n] of [n]th additional bit line pair through [n]th first complementary switch 212b0[n] after first m rows (that is, after row number [0] to [m−1]) and through [n]th second complementary switch 212a1[n−1] after second m rows (that is, after row number [m] to [2m−1]). In example embodiments, m rows includes between 16 rows and 256 rows.

[n]th complementary bit line LBLB[n] 208b[n] of [n]th bit line pair is connected to [n]th additional complementary bit line HBLB[n] 210b[n] of [n]th additional bit line pair when one or more of the plurality of [n]th complementary switches are switched ON. For example, [n]th complementary bit line LBLB[n] 208b[n] of [n]th bit line pair is connected to [n]th additional complementary bit line HBLB[n] 210b[n] of [n]th additional bit line pair when one or both of [n]th first complementary switch 212b0[n] and [n]th second complementary switch 212b1[n] are switched ON. By extension, [n]th complementary bit line LBLB[n] 208b[n] of [n]th bit line pair is disconnected from [n]th additional complementary bit line HBLB[n] 210b[n] of [n]th additional bit line pair when both of [n]th first complementary switch 212b0[n] and [n]th second complementary switch 212b1[n] are switched OFF.

In example embodiments, each of [n]th first complementary switch 212b0[n] and [n]th second complementary switch 212b1[n] is a n-channel metal oxide semiconductor (nMOS) transistor. However, other types of transistors, for example, a MOSFET, a pMOS transistor, a CMOS transistor, etc., are within the scope of the disclosure. A source of each of [n]th first complementary switch 212b0[n] and [n]th second complementary switch 212b1[n] is connected to [n]th complementary bit line LBLB[n] 208b[n] and a drain of each of [n]th first complementary switch 212b0[n] and [n]th second complementary switch 212b1[n] is connected to [n]th additional complementary bit line HBLB[n] 210b[n]. However, each of [n]th first complementary switch 212b0[n] and [n]th second complementary switch 212b1[n] is symmetrical. Hence, a source of each of [n]th first complementary switch 212b0[n] and [n]th second complementary switch 212b1[n] can be a drain and a drain can be a source.

Gates of each of the switches connecting a bit line pair with an additional bit line pair located in a row are connected to a write enable line WEL. Hence, the write enable lines WEL can be shared with whole columns and no column selector circuit is required for selecting write enable lines WEL. In addition, the write enable line WEL do not need an address decoder as they are directly associated with a write enable signal. For example, gates of each of [n−1]th first switch 212a0[n−1], [n−1]th first complementary switch 212b0[n−1], [n]th first switch 212a0[n], and [n]th first complementary switch 212b0[n] are connected to a first write enable line WEL[0] 214[0]. Hence, each of [n−1]th first switch 212a0[n−1], [n−1]th first complementary switch 212b0[n−1], [n]th first switch 212a0[n], and [n]th first complementary switch 212b0[n] are switched ON when first write enable line WEL[0] 214[0] is at a logic high and are switched OFF when first write enable line WEL[0] 214[0] is at a logic low.

In addition, gates of each of [n−1]th second switch 212a1[n−1], [n−1]th second complementary switch 212b1[n−1], [n]th second switch 212b1[n], and [n]th second complementary switch 212b1[n] are connected to a second write enable line WEL[1] 214[1]. Hence, each of [n−1]th second switch 212a1[n−1], [n−1]th second complementary switch 212b1[n−1], [n]th second switch 212a1[n], and [n]th second complementary switch 212b1[n] are switched ON when second write enable line WEL[1] 214[1] is at a logic high and are switched OFF when second write enable line WEL[1] 214[1] is at a logic low.

In example embodiments, first write enable line WEL[0] 214[0] and second write enable line WEL[1] 214[1] are connected to write enable driver circuit 218. Write enable driver circuit 218 is operative to charge first write enable line WEL[0] 214[0] and second write enable line WEL[1] 214[1] to a logic high for a write operation, thereby connecting a bit line pair with an associated additional bit line pair. For example, when first write enable line WEL[0] 214[0] and second write enable line WEL[1] 214[1] are charged to a logic high, each of [n−1]th first switch 212a0[n−1] and [n−1]th second switch 212a1[n−1] are switched ON connecting [n−1]th bit line LBL[n−1] 208a[n−1] with [n−1]th first additional bit line HBL[n−1] 210a[n−1]. In addition, when first write enable line WEL[0] 214[0] and second write enable line WEL[1] 214[1] are charged to a logic high, each of [n−1]th first complementary switch 212b0[n−1] and [n−1]th second complementary switch 212b1[n−1] are switched ON connecting [n−1]th complementary bit line LBLB[n−1] 208b[n−1] with [n−1]th first additional complementary bit line HBLB[n−1] 210b[n−1].

In addition, when first write enable line WEL[0] 214[0] and second write enable line WEL[1] 214[1] are charged to a logic high, each of [n]th first switch 212a0[n] and [n]th second switch 212a1[n] are switched ON connecting [n]th bit line LBL[n] 208a[n] with [n]th first additional bit line HBL[n] 210a[n]. Moreover, when first write enable line WEL[0] 214[0] and second write enable line WEL[1] 214[1] are charged to a logic high, each of [n]th first complementary switch 212b0[n] and [n]th second complementary switch 212b1[n] are switched ON connecting [n]th complementary bit line LBLB[n] 208b[n] with [n]th first additional complementary bit line HBLB[n] 210b[n].

Connecting an additional bit line pair to an existing bit line pair for a write operation reduces an effective bit line resistance for a selected column. Write enable driver circuit 218 is operative to charge first write enable line WEL[0] 214[0] and second write enable line WEL[1] 214[1] to a logic low for a read operation. During a read operation, the addition bit line pairs are not connected to a corresponding bit line pair.

Figure 3:
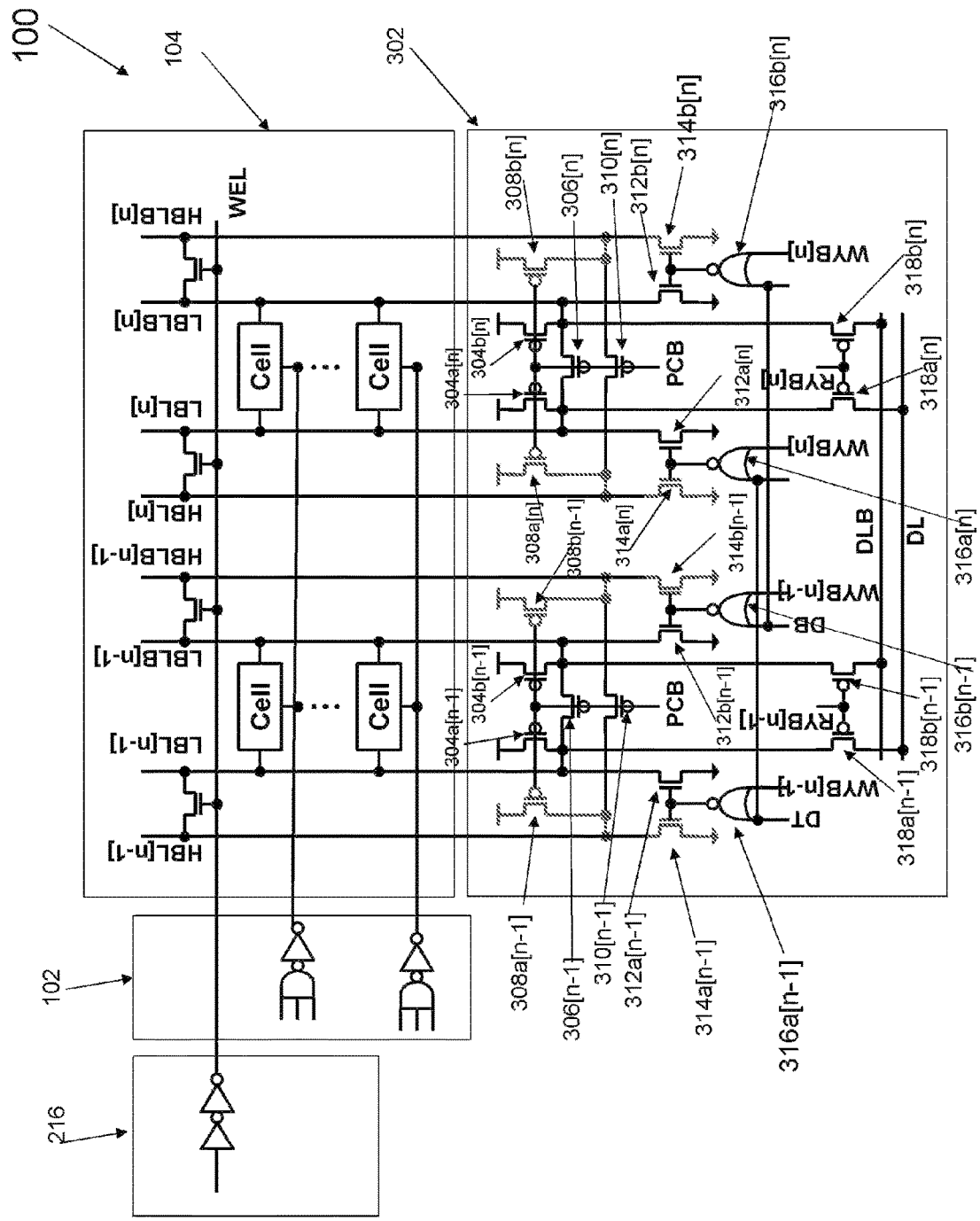
FIG. 3 is a diagram of an example memory device illustrating an example input/output circuit, in accordance with some embodiments.

FIG. 3 is diagram of memory device 100 depicting an example input/output (I/O) circuit 302 in accordance with some embodiments. I/O circuit 302 is operative to read data from or write data to cell array 104. As shown in FIG. 3, I/O circuit 302 includes a [n−1]th pre-charge circuit first transistor 304a[n−1] and a [n−1]th pre-charge circuit second transistor 304b[n−1]. In addition, I/O circuit 302 includes a [n−1]th pre-charge circuit third transistor 306 [n−1]. Both [n−1]th pre-charge circuit first transistor 304a[n−1] and [n−1]th pre-charge circuit second transistor 304b[n−1] are pMOS transistors. However, other types of transistors, for example, a MOSFET, a nMOS transistor, a CMOS transistor, etc., are within the scope of the disclosure. In addition, [n−1]th pre-charge circuit third transistor 306 [n−1] is a nMOS transistor. However, other types of transistors, for example, a MOSFET, a pMOS transistor, a CMOS transistor, etc., are within the scope of the disclosure.

A source of each of [n−1]th pre-charge circuit first transistor 304a[n−1] and [n−1]th pre-charge circuit second transistor 304b[n−1] is connected to a supply voltage (that is, VDD). A drain of [n−1]th pre-charge circuit first transistor 304a[n−1] is connected to a source of [n−1]th pre-charge circuit third transistor 306[n−1] which in turn is connected to [n−1]th bit line LBL[n−1] 208a[n−1]. A drain of [n−1]th pre-charge circuit second transistor 304b[n−1] is connected to a drain of [n−1]th pre-charge circuit third transistor 306[n−1] which in turn is connected to [n−1]th complementary bit line LBLB[n−1] 208b[n−1].

In example embodiments, each of [n−1]th pre-charge circuit first transistor 304a[n−1], [n−1]th pre-charge circuit second transistor 304b[n−1], and [n−1]th pre-charge circuit third transistor 306[n−1] are symmetrical. Hence, a source of each of [n−1]th pre-charge circuit first transistor 304a[n−1], [n−1]th pre-charge circuit second transistor 304b[n−1], and [n−1]th pre-charge circuit third transistor 306[n−1] can be a drain, and a drain can be a source. In examples, [n−1]th pre-charge circuit first transistor 304a[n−1], [n−1]th pre-charge circuit second transistor 304b[n−1], and [n−1]th pre-charge circuit third transistor 306 [n−1] are also referred to as existing transistors.

A gate of [n−1]th pre-charge circuit first transistor 304a[n−1] is connected to a gate of [n−1]th pre-charge circuit second transistor 304b[n−1] which in turn is connected to a gate of [n−1]th pre-charge circuit third transistor 306[n−1]. The gate of [n−1]th pre-charge circuit third transistor 310 [n−1] is also connected to a pre-charge bar PCB terminal. In example embodiments, when the pre-charge bar PCB terminal is at a logic low, [n−1]th bit line LBL[n−1] 208a[n−1] and [n−1]th complementary bit line LBLB[n−1] 208b[n−1] are pre-charged. However, when the pre-charge bar PCB terminal is at a logic high, [n−1]th bit line LBL[n−1] 208a[n−1] and [n−1]th complementary bit line LBLB[n−1] 208b[n−1] are floating for a read and write operation. [n−1]th bit line LBL[n−1] 208a[n−1] and [n−1]th complementary bit line LBLB[n−1] 208b[n−1] are pre-charged for a read operation or a write operation.

Moreover, I/O circuit 302 includes a [n−1]th pre-charge circuit first additional transistor 308a[n−1] and a [n−1]th pre-charge circuit second additional transistor 308b[n−1]. I/O circuit 302 further includes a [n−1]th pre-charge circuit third additional transistor 310 [n−1]. Both [n−1]th pre-charge circuit first additional transistor 308a[n−1] and [n−1]th pre-charge circuit second additional transistor 30bb[n−1] are pMOS transistors. However, other types of transistors, for example, a MOSFET, a nMOS transistor, a CMOS transistor, etc., are within the scope of the disclosure. In addition, [n−1]th pre-charge circuit third additional transistor 310 [n−1] is a nMOS transistor. However, other types of transistors, for example, a MOSFET, a pMOS transistor, a CMOS transistor, etc., are within the scope of the disclosure.

A source of each of [n−1]th pre-charge circuit first additional transistor 308a[n−1] and [n−1]th pre-charge circuit second additional transistor 308b[n−1] is connected to a supply voltage (that is, VDD). A drain of [n−1]th pre-charge circuit first additional transistor 308a[n−1] is connected to a source of [n−1]th pre-charge circuit third additional transistor 310[n−1] which in turn is connected to [n−1]th additional bit line HBL[n−1] 210a[n−1]. A drain of [n−1]th pre-charge circuit second additional transistor 308b[n−1] is connected to a drain of [n−1]th pre-charge circuit third additional transistor 310[n−1] which in turn is connected to [n−1]th complementary additional bit line HBLB[n−1] 210b[n−1].

In example embodiments, each of [n−1]th pre-charge circuit first additional transistor 308a[n−1], [n−1]th pre-charge circuit second additional transistor 308b[n−1], and [n−1]th pre-charge circuit third additional transistor 310[n−1] are symmetrical. Hence, a source of each of [n−1]th pre-charge circuit first additional transistor 308a[n−1], [n−1]th pre-charge circuit second additional transistor 308b[n−1], and [n−1]th pre-charge circuit third additional transistor 310[n−1] can be a drain, and a drain can be a source. In examples, [n−1]th pre-charge circuit first additional transistor 308a[n−1], [n−1]th pre-charge circuit second additional transistor 308b[n−1], and [n−1]th pre-charge circuit third additional transistor 310[n−1] are smaller in size than [n−1]th pre-charge circuit first transistor 304a[n−1], [n−1]th pre-charge circuit second transistor 304b[n−1], and [n−1]th pre-charge circuit third transistor 306 [n−1] (that is, the existing transistors).

A gate of [n−1]th pre-charge circuit first additional transistor 308a[n−1] is connected to a gate of [n−1]th pre-charge circuit second additional transistor 308b[n−1] which in turn is connected to a gate of [n−1]th pre-charge circuit third additional transistor 310[n−1]. The gate of [n−1]th pre-charge circuit third additional transistor 310[n−1] is also connected to the pre-charge bar PCB terminal. In example embodiments, when the pre-charge bar PCB terminal is at a logic low, [n−1]th additional bit line HBL[n−1] 210a[n−1] and [n−1]th additional complementary bit line HBLB[n−1] 210b[n−1] are pre-charged. However, when the pre-charge bar PCB terminal is at a logic high, [n−1]th additional bit line HBL[n−1] 210a[n−1] and [n−1]th additional complementary bit line HBLB[n−1] 210b[n−1] are floating for a write operation. In examples, therefore, [n−1]th additional bit line HBL[n−1] 210a[n−1] and [n−1]th additional complementary bit line HBLB[n−1] 210b[n−1] are pre-charged using an existing pre-charge bar PCB terminal.

Still continuing with FIG. 3, I/O circuit 302 further includes a [n−1]th write select circuit first transistor 312a[n−1] and a [n−1]th write select circuit second transistor 312b[n−1]. A source of [n−1]th write select circuit first transistor 312a[n−1] is connected to [n−1]th bit line LBL[n−1] 208a[n−1] and a source of [n−1]th write select circuit second transistor 312b[n−1] is connected to [n−1]th complementary bit line LBLB[n−1] 208b[n−1]. A drain of each of [n−1]th write select circuit first transistor 312a[n−1] and [n−1]th write select circuit second transistor 312b[n−1] is connected to ground.

In example embodiments, each of [n−1]th write select circuit first transistor 312a[n−1] and [n−1]th write select circuit second transistor 312b[n−1] is an nMOS transistor. However, other types of transistors, for example, a MOSFET, a pMOS transistor, a CMOS transistor, etc., are within the scope of the disclosure. In addition, each of [n−1]th write select circuit first transistor 312a[n−1] and [n−1]th write select circuit second transistor 312b[n−1] are symmetrical. Hence, a source of each of [n−1]th write select circuit first transistor 312a[n−1] and [n−1]th write select circuit second transistor 312b[n−1] can be a drain, and a drain can be a source. In examples, [n−1]th write select circuit first transistor 312a[n−1] and [n−1]th write select circuit second transistor 312b[n−1] are also referred to as existing transistors.

I/O circuit 302 further includes a [n−1]th write select circuit first additional transistor 314a[n−1] and a [n−1]th write select circuit second additional transistor 314b[n−1]. A source of [n−1]th write select circuit first transistor 312a[n−1] is connected to [n−1]th additional bit line HBL[n−1] 210a[n−1] and a source of [n−1]th write select circuit second additional transistor 314b[n−1] is connected to [n−1]th complementary additional bit line HBLB[n−1] 210b[n−1]. A drain of each of [n−1]th write select circuit first additional transistor 314a[n−1] and [n−1]th write select circuit second additional transistor 314b[n−1] is connected to ground. Moreover, a gate of [n−1]th write select circuit first transistor 312a[n−1] is connected to a gate of [n−1]th write select circuit first additional transistor 314a[n−1]. In addition, a gate of [n−1]th write select circuit second transistor 312b[n−1] is connected to a gate of [n−1]th write select circuit second additional transistor 314b[n−1].

In example embodiments, each of [n−1]th write select circuit first additional transistor 314a[n−1] and [n−1]th write select circuit second additional transistor 314b[n−1] is a nMOS transistor. However, other types of transistors, for example, a MOSFET, a pMOS transistor, a CMOS transistor, etc., are within the scope of the disclosure. In addition, each of [n−1]th write select circuit first additional transistor 314a[n−1] and [n−1]th write select circuit second additional transistor 314b[n−1], are symmetrical. Hence, a source of each of [n−1]th write select circuit first additional transistor 314a[n−1] and [n−1]th write select circuit second additional transistor 314b[n−1] can be a drain, and a drain can be a source. In examples, [n−1]th write select circuit first additional transistor 314a[n−1] and [n−1]th write select circuit second additional transistor 314b[n−1] are smaller in size than [n−1]th write select circuit first transistor 312a[n−1] and [n−1]th write select circuit second transistor 312b[n−1] (that is, the existing transistors).

I/O circuit 302 further includes a [n−1]th write select first logic circuit 316a[n−1] and a [n−1]th write select second logic circuit 316b[n−1]. Each of [n−1]th write select first logic circuit 316a[n−1] and [n−1]th write select second logic circuit 316b[n−1] includes a NOR logic gate. However, other types of logic circuits are within the scope of the disclosure.

A first input terminal of [n−1]th write select first logic circuit 316a[n−1] is connected to data input true (DT) terminal and a second input terminal of [n−1]th write select first logic circuit 316a[n−1] is connected to a [n−1]th write select bit WYB[n−1] terminal. An output terminal of [n−1]th write select first logic circuit 316a[n−1] is connected to a gate of each of [n−1]th write select circuit first transistor 312a[n−1] and [n−1]th write select circuit first additional transistor 314a[n−1].

A first input terminal of [n−1]th write select second logic circuit 316b[n−1] is connected to data input bar (DB) terminal and a second input terminal of [n−1]th write select second logic circuit 316b[n−1] is connected to [n−1]th write select bit WYB[n−1] terminal. An output terminal of [n−1]th write select second logic circuit 316b[n−1] is connected to a gate of each of [n−1]th write select circuit second transistor 312b[n−1] and [n−1]th write select circuit second additional transistor 314b[n−1]. In example embodiments, when the [n−1]th write select bit WYB[n−1] is at a logic low, a write operation is selected by both [n−1]th write select first logic circuit 316a[n−1] and [n−1]th write select second logic circuit 316b[n−1]. However, when the [n−1]th write select bit WYB[n−1] is at a logic high, a write operation is not selected by any of [n−1]th write select first logic circuit 316a[n−1] and [n−1]th write select second logic circuit 316b[n−1]. In addition, when the write operation is selected, and when the data input true (DT) terminal is at a logic high, a bit value of 1 is written in cell array 104. Moreover, when the write operation is selected, and when the data input true (DT) terminal is at a logic low, a bit value of 0 is written in cell array 104.

I/O circuit 302 further includes a [n−1]th read select circuit first transistor 318a[n−1] and a [n−1]th read select circuit second transistor 318b[n−1]. A source of [n−1]th read select circuit first transistor 318a[n−1] is connected to a drain of [n−1]th pre-charge circuit first transistor 304a[n−1] which is connected to [n−1]th bit line LBL[n−1] 208a[n−1]. Similarly, a source of [n−1]th read select circuit second transistor 318b[n−1] is connected to a drain of [n−1]th pre-charge circuit second transistor 304b[n−1] which is connected to [n−1]th complementary bit line LBLB[n−1] 208b[n−1]. A drain of [n−1]th read select circuit first additional transistor 318a[n−1] is connected to a data line DL and a drain of [n−1]th read select circuit second transistor 318b[n−1] is connected to a data line bar DLB terminal. The data line DL and the data line bar DLB terminal are used for reading data from cell array 104.

Moreover, a gate of [n−1]th read select circuit first transistor 318a[n−1] is connected to a gate of [n−1]th read select circuit second transistor 318b[n−1] which in turn is connected to a [n−1]th read select bit RYB[n−1] terminal. In example embodiments, when the [n−1]th read select bit RYB[n−1] is at a logic low, a read operation is selected. However, when the [n−1]th read select bit RYB[n−1] is at a logic high, a read operation is not selected.

In example embodiments, each of [n−1]th read select circuit first transistor 318a[n−1] and [n−1]th read select circuit second transistor 318b[n−1] is a pMOS transistor. However, other types of transistors, for example, a MOSFET, a nMOS transistor, a CMOS transistor, etc., are within the scope of the disclosure. In addition, each of [n−1]th read select circuit first transistor 318a[n−1] and [n−1]th read select circuit second transistor 318b[n−1], are symmetrical. Hence, a source of each of [n−1]th read select circuit first transistor 318a[n−1] and [n−1]th read select circuit second transistor 318b[n−1] can be a drain, and a drain can be a source.

Continuing with FIG. 3, I/O circuit 302 further includes a [n]th pre-charge circuit first transistor 304a[n] and a [n]th pre-charge circuit second transistor 304b[n]. In addition, I/O circuit 302 includes a [n]th pre-charge circuit third transistor 306 [n]. Both [n]th pre-charge circuit first transistor 304a[n] and [n]th pre-charge circuit second transistor 304b[n] are pMOS transistors. However, other types of transistors, for example, a MOSFET, a nMOS transistor, a CMOS transistor, etc., are within the scope of the disclosure. In addition, [n]th pre-charge circuit third transistor 306 [n] is a nMOS transistor. However, other types of transistors, for example, a MOSFET, a pMOS transistor, a CMOS transistor, etc., are within the scope of the disclosure.

A source of each of [n]th pre-charge circuit first transistor 304a[n] and [n]th pre-charge circuit second transistor 304b[n] is connected to a supply voltage (that is, VDD). A drain of [n]th pre-charge circuit first transistor 304a[n] is connected to a source of [n]th pre-charge circuit third transistor 306[n] which in turn is connected to [n]th bit line LBL[n] 208a[n]. A drain of [n]th pre-charge circuit second transistor 304b[n] is connected to a drain of [n]th pre-charge circuit third transistor 306[n] which in turn is connected to [n]th complementary bit line LBLB[n] 208b[n].

In example embodiments, each of [n]th pre-charge circuit first transistor 304a[n], [n]th pre-charge circuit second transistor 304b[n], and [n]th pre-charge circuit third transistor 306[n] are symmetrical. Hence, a source of each of [n]th pre-charge circuit first transistor 304a[n], [n]th pre-charge circuit second transistor 304b[n], and [n]th pre-charge circuit third transistor 306[n] can be a drain, and a drain can be a source. In examples, [n]th pre-charge circuit first transistor 304a[n], [n]th pre-charge circuit second transistor 304b[n], and [n]th pre-charge circuit third transistor 306 [n] are also referred to as existing transistors.

A gate of [n]th pre-charge circuit first transistor 304a[n] is connected to a gate of [n]th pre-charge circuit second transistor 304b[n] which in turn is connected to a gate of [n]th pre-charge circuit third transistor 306[n]. The gate of [n]th pre-charge circuit third transistor 310[n] is also connected to a pre-charge bar PCB terminal. In example embodiments, when the pre-charge bar PCB terminal is at a logic low, [n]th bit line LBL[n] 208a[n] and [n]th complementary bit line LBLB[n] 208b[n] are pre-charged. However, when the pre-charge bar PCB is at a logic high, [n]th bit line LBL[n] 208a[n] and [n]th complementary bit line LBLB[n] 208b[n] are floating for a read and write operation. [n]th bit line LBL[n] 208a[n] and [n]th complementary bit line LBLB[n] 208b[n] are pre-charged for a read operation or a write operation.

Moreover, I/O block 302 includes a [n]th pre-charge circuit first additional transistor 308a[n] and a [n]th pre-charge circuit second additional transistor 308b[n]. In addition, I/O block 302 includes a [n]th pre-charge circuit third additional transistor 310 [n]. Both [n]th pre-charge circuit first additional transistor 308a[n] and [n]th pre-charge circuit second additional transistor 30bb[n] are pMOS transistors. However, other types of transistors, for example, a MOSFET, a pMOS transistor, a CMOS transistor, etc., are within the scope of the disclosure. In addition, [n]th pre-charge circuit third additional transistor 310 [n] is a nMOS transistor. However, other types of transistors, for example, a MOSFET, a pMOS transistor, a CMOS transistor, etc., are within the scope of the disclosure.

A source of each of [n]th pre-charge circuit first additional transistor 308a[n] and [n]th pre-charge circuit second additional transistor 308b[n] is connected to a supply voltage (that is, VDD). A drain of [n]th pre-charge circuit first additional transistor 308a[n] is connected to a source of [n]th pre-charge circuit third additional transistor 310[n] which in turn is connected to [n]th additional bit line HBL[n] 210a[n]. A drain of [n]th pre-charge circuit second additional transistor 308b[n] is connected to a drain of [n]th pre-charge circuit third additional transistor 310[n] which in turn is connected to [n]th complementary additional bit line HBLB[n] 210b[n].

In example embodiments, each of [n]th pre-charge circuit first additional transistor 308a[n], [n]th pre-charge circuit second additional transistor 308b[n], and [n]th pre-charge circuit third additional transistor 310[n] are symmetrical. Hence, a source of each of [n]th pre-charge circuit first additional transistor 308a[n], [n]th pre-charge circuit second additional transistor 308b[n], and [n]th pre-charge circuit third additional transistor 310[n] can be a drain, and a drain can be a source. In examples, [n]th pre-charge circuit first additional transistor 308a[n], [n]th pre-charge circuit second additional transistor 308b[n], and [n]th pre-charge circuit third additional transistor 310[n] are smaller in size than [n]th pre-charge circuit first transistor 304a[n], [n]th pre-charge circuit second transistor 304b[n], and [n]th pre-charge circuit third transistor 306 [n] (that is, the existing transistors).

A gate of [n]th pre-charge circuit first additional transistor 308a[n] is connected to a gate of [n]th pre-charge circuit second additional transistor 308b[n] which in turn is connected to a gate of [n]th pre-charge circuit third additional transistor 310[n]. The gate of [n]th pre-charge circuit third additional transistor 310[n] is also connected to the pre-charge bar PCB terminal. In example embodiments, when the pre-charge bar PCB terminal is at a logic low, [n]th additional bit line HBL[n] 210a[n] and [n]th additional complementary bit line HBLB[n] 210b[n] are pre-charged. However, when the pre-charge bar PCB terminal is at a logic high, [n]th additional bit line HBL[n] 210a[n] and [n]th additional complementary bit line HBLB[n] 210b[n] are floating for a write operation. In examples, therefore, [n]th additional bit line HBL[n] 210a[n] and [n]th additional complementary bit line HBLB[n] 210b[n] are pre-charged using an existing pre-charge bar PCB terminal.

Still continuing with FIG. 3, I/O circuit 302 further includes a [n]th write select circuit first transistor 312a[n] and a [n]th write select circuit second transistor 312b[n]. A source of [n]th write select circuit first transistor 312a[n] is connected to [n]th bit line LBL[n] 208a[n] and a source of [n]th write select circuit second transistor 312b[n] is connected to [n]th complementary bit line LBLB[n] 208b[n]. A drain of each of [n]th write select circuit first transistor 312a[n] and [n]th write select circuit second transistor 312b[n] is connected to ground.

In example embodiments, each of [n]th write select circuit first transistor 312a[n] and [n]th write select circuit second transistor 312b[n] is an nMOS transistor. However, other types of transistors, for example, a MOSFET, a pMOS transistor, a CMOS transistor, etc., are within the scope of the disclosure. In addition, each of [n]th write select circuit first transistor 312a[n] and [n]th write select circuit second transistor 312b[n] are symmetrical. Hence, a source of each of [n]th write select circuit first transistor 312a[n] and [n]th write select circuit second transistor 312b[n] can be a drain, and a drain can be a source. In examples, [n]th write select circuit first transistor 312a[n] and [n]th write select circuit second transistor 312b[n] are also referred to as existing transistors.

I/O block 302 further includes a [n]th write select circuit first additional transistor 314a[n] and a [n]th write select circuit second additional transistor 314b[n]. A source of [n]th write select circuit first transistor 312a[n] is connected to [n]th additional bit line HBL[n] 210a[n] and a source of [n]th write select circuit second additional transistor 314b[n] is connected to [n]th complementary additional bit line HBLB[n] 210b[n]. A drain of each of [n]th write select circuit first additional transistor 314a[n] and [n]th write select circuit second additional transistor 314b[n] is connected to ground. Moreover, a gate of [n]th write select circuit first transistor 312a[n] is connected to a gate of [n]th write select circuit first additional transistor 314a[n]. In addition, a gate of [n]th write select circuit second transistor 312b[n] is connected to a gate of [n]th write select circuit second additional transistor 314b[n].

In example embodiments, each of [n]th write select circuit first additional transistor 314a[n] and [n]th write select circuit second additional transistor 314b[n] is a nMOS transistor. However, other types of transistors, for example, a MOSFET, a pMOS transistor, a CMOS transistor, etc., are within the scope of the disclosure. In addition, each of [n]th write select circuit first additional transistor 314a[n] and [n]th write select circuit second additional transistor 314b [n], are symmetrical. Hence, a source of each of [n]th write select circuit first additional transistor 314a[n] and [n]th write select circuit second additional transistor 314b[n] can be a drain, and a drain can be a source. In examples, [n]th write select circuit first additional transistor 314a[n] and [n]th write select circuit second additional transistor 314b[n] are smaller in size than [n]th write select circuit first transistor 312a[n] and [n]th write select circuit second transistor 312b[n] (that is, the existing transistors).

I/O block 302 further includes a [n]th write select first logic circuit 316a[n] and a [n]th write select second logic circuit 316b[n]. Each of [n]th write select first logic circuit 316a[n] and [n]th write select second logic circuit 316b[n] includes a NOR logic gate. However, other types of logic circuits are within the scope of the disclosure.

A first input terminal of [n]th write select first logic circuit 316a[n] is connected to data input true (DT) terminal and a second input terminal of [n]th write select first logic circuit 316a[n] is connected to a [n]th write select bit WYB[n] terminal. An output terminal of [n]th write select first logic circuit 316a[n] is connected to a gate of each of [n]th write select circuit first transistor 312a[n] and [n]th write select circuit first additional transistor 314a[n].

A first input terminal of [n]th write select second logic circuit 316b[n] is connected to data input bar (DB) terminal and a second input terminal of [n]th write select second logic circuit 316b[n] is connected to [n]th write select bit WYB[n] terminal. An output terminal of [n]th write select second logic circuit 316b[n] is connected to a gate of each of [n]th write select circuit second transistor 312b[n] and [n]th write select circuit second additional transistor 314b[n]. In example embodiments, when the [n]th write select bit WYB[n] is at a logic low, a write operation is selected by both [n]th write select first logic circuit 316a[n] and [n]th write select second logic circuit 316b[n]. However, when the [n]th write select bit WYB[n] is at a logic high, a write operation is not selected by any of [n]th write select first logic circuit 316a[n] and [n]th write select second logic circuit 316b[n]. In addition, when the write operation is selected, and when the data input true (DT) terminal is at a logic high, a bit value of 1 is written in cell array 104. Moreover, when the write operation is selected, and when the data input true (DT) terminal is at a logic low, a bit value of 0 is written in cell array 104.

I/O circuit 302 further includes a [n]th read select circuit first transistor 318a[n] and a [n]th read select circuit second transistor 318b[n]. A source of [n]th read select circuit first transistor 318a[n] is connected to a drain of [n]th pre-charge circuit first transistor 304a[n] which is connected to [n]th bit line LBL[n] 208a[n]. In addition, a source of [n]th read select circuit second transistor 318b[n] is connected to a drain of [n]th pre-charge circuit second transistor 304b[n] which is connected to [n]th complementary bit line LBLB[n] 208b[n]. A drain of [n]th read select circuit first additional transistor 318a[n] is connected to a data line DL terminal and a drain of [n]th read select circuit second transistor 318b[n] is connected to a data line bar DLB terminal. The data line DL and the data line bar DLB terminal are used for reading data from cell array 104.

Moreover, a gate of [n]th read select circuit first transistor 318a[n] is connected to a gate of [n]th read select circuit second transistor 318b[n] which in turn is connected to a [n]th read select bit RYB[n] terminal. In example embodiments, when the [n]th read select bit RYB[n] is at a logic low, a read operation is selected. However, when the [n]th read select bit RYB[n] is at a logic high, a read operation is not selected.

In example embodiments, each of [n]th read select circuit first transistor 318a[n] and [n]th read select circuit second transistor 318b[n] is a pMOS transistor. However, other types of transistors, for example, a MOSFET, a nMOS transistor, a CMOS transistor, etc., are within the scope of the disclosure. In addition, each of [n]th read select circuit first transistor 318a[n] and [n]th read select circuit second transistor 318b[n], are symmetrical. Hence, a source of each of [n]th read select circuit first transistor 318a[n] and [n]th read select circuit second transistor 318b[n] can be a drain, and a drain can be a source.

Figure 4:
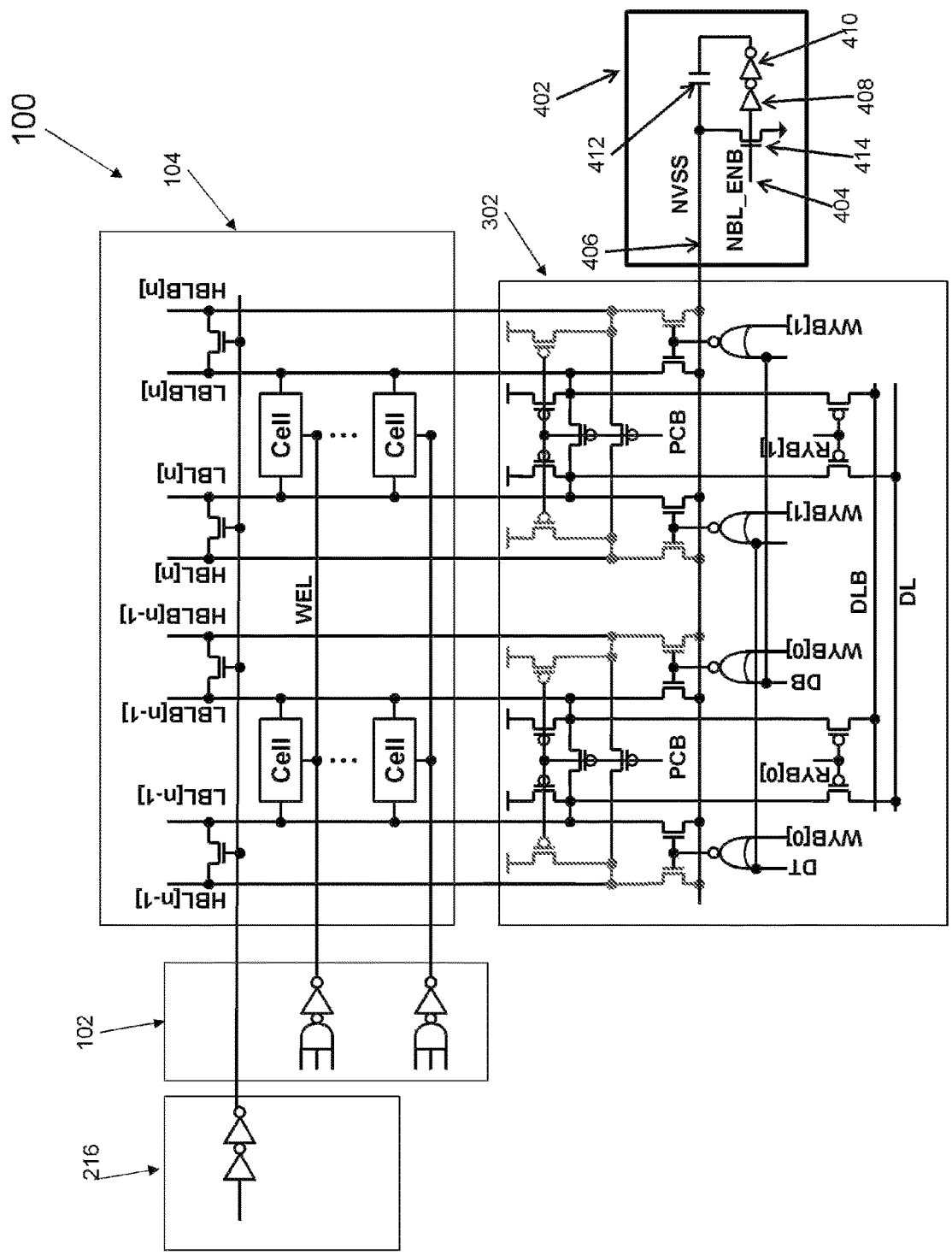
FIG. 4 is a diagram of an example memory device illustrating an example negative voltage generator circuit, in accordance with some embodiments.

FIG. 4 illustrates memory device 100 with a negative voltage generator circuit 402 in accordance with some embodiments. Negative voltage generator circuit 402 of memory device 100 includes a negative voltage generator input terminal 404 and a negative voltage generator output terminal 406. Negative voltage generator input terminal 404 is operative to receive a write assist signal (represented as NBL_ENB). Negative voltage generator output terminal 406 is operative to provide a negative voltage (also referred to as NVSS) which is applied to first node 214 to lower the Vccmin for a write operation. For example, the negative voltage is provided at negative voltage generator output terminal 406 which is connected to the plurality of bit line pairs and the plurality of additional bit line pairs.

As shown in FIG. 4, negative voltage generator circuit 402 includes a negative voltage generator first logic gate 408, a negative voltage generator second logic gate 410, a negative voltage generator capacitor 412, and a negative voltage generator transistor 414. An input of negative voltage generator first logic gate 408 is connected to negative voltage generator input terminal 404. An output of negative voltage generator first logic gate 406 is connected to an input of negative voltage generator second logic gate 408. Thus, negative voltage generator first logic gate 406 provides an inverse of the write assist signal to the input of negative voltage generator second logic gate 408. Negative voltage generator second logic gate 408 is operative to provide an inverse of an inverted write assist signal as an output. Therefore, negative voltage generator first logic gate 406 and negative voltage generator second logic gate 408 in combination form a delay circuit. The output of negative voltage generator second logic gate 408 is connected to a first terminal of negative voltage generator capacitor 412. A second terminal of negative voltage generator capacitor 412 is connected to negative voltage generator output terminal 406.

A source of negative voltage generator transistor 414 is connected to negative voltage generator output terminal 406. A drain of negative voltage generator transistor 414 is connected to ground. A gate of negative voltage generator transistor 414 is connected to negative voltage generator input terminal 404. In example embodiment, negative voltage generator transistor 414 is symmetrical, thus, the source can be selected to be the drain while the drain can be selected to be the source. Moreover, although negative voltage generator transistor 414 is shown to be an nMOS transistor, other types of transistors are within the scope of the disclosure. For example, negative voltage generator transistor 414 may be a MOSFET, a pMOS transistor, and a CMOS transistor.

Generally, a write operation in memory device 100 is triggered by a write enable signal. That is, the write operation is triggered when the write enable signal changes from a first logic value to a second logic value (for example, from a logic value low to a logic value high, or vice versa. The write assist signal can be generated from the write enable signal. For example, in some examples, the write assist signal may be linked with the write enable signal and be responsive to the write enable signal. A write assist signal generator circuit (not shown) may be provided to generate the write assist signal. For example, when the write enable signal changes to a logic high indicating initiation of the write operation, the write assist signal may also change to a logic low enabling negative voltage generator circuit 104. In addition, when the write enable signal changes to a logic low indicating an end of the write operation, the write assist signal may change to a logic low disabling negative voltage generator circuit 402.

During a write operation, when the write assist signal is at a logic high, the gate of negative voltage generator transistor 414 is also at a logic high, which switches negative voltage generator transistor 414 ON which results in charging of negative voltage generator capacitor 412. In this configuration, negative voltage generator circuit 402 is labeled as not enabled or disabled. However, when the write assist signal changes to a logic low, the gate of negative voltage generator transistor 414 is also at a logic low, which switches negative voltage generator transistor 414 OFF. This causes a discharge from negative voltage generator capacitor 412, which drives a voltage at negative voltage generator output terminal 406 to a negative value. This negative voltage is provided to the bit line BL, which provides a boost for the write operation performed to bit cells coupled to the bit line BL. In this configuration, negative voltage generator circuit 402 is labeled as enabled.

Figure 5:
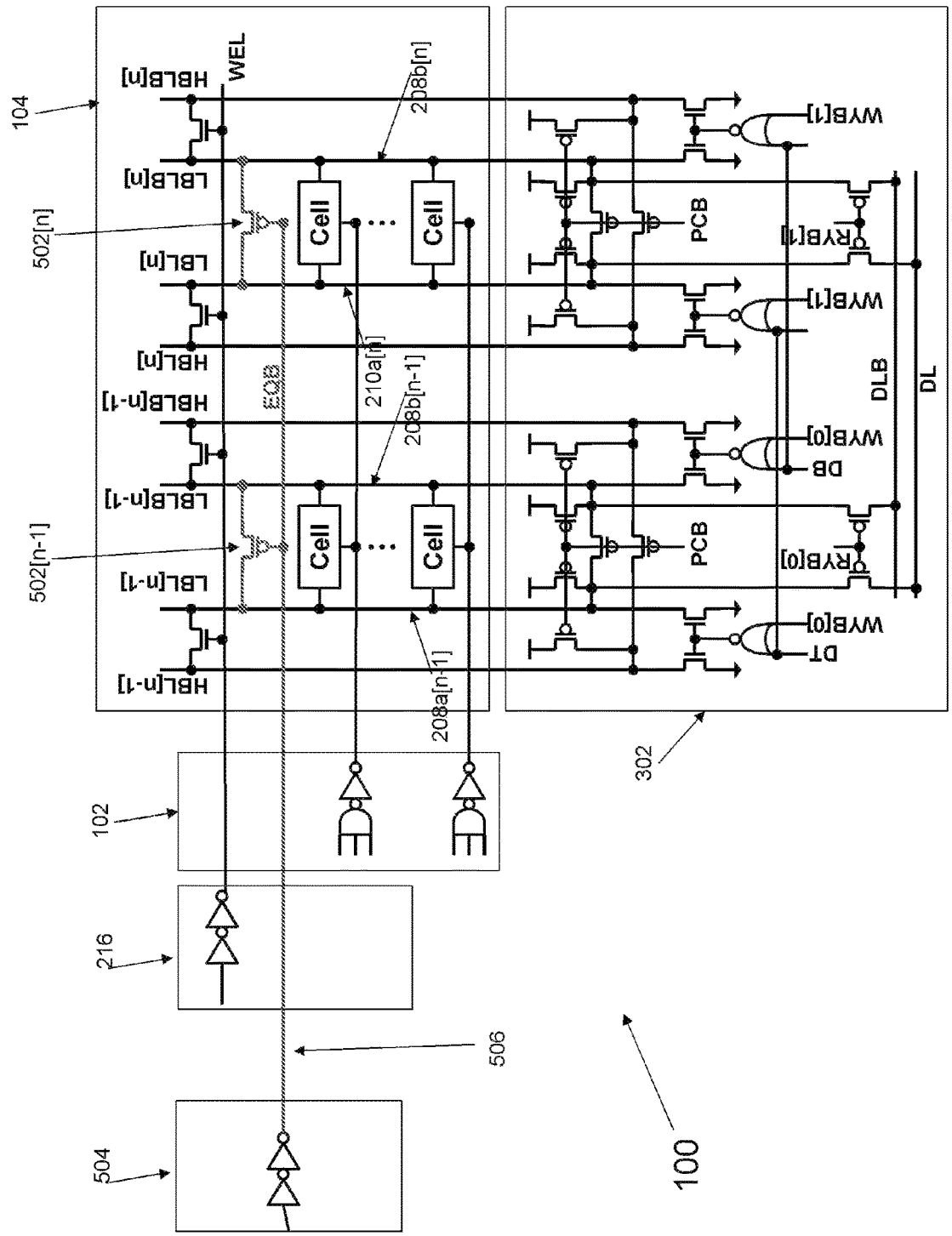
FIG. 5 is a diagram illustrating an example memory device with example equalizer switches, in accordance with some embodiments.

FIG. 5 illustrates memory device 100 with a plurality of equalizer switches in accordance with some embodiments. In examples, one equalizer switch is provided for each column of cell array 104. For example, as shown in FIG. 5, cell array 102 of memory device 100 includes a [n−1]th equalizer switch 502[n−1] and a [n]th equalizer switch 502[n]. Each of [n−1]th equalizer switch 502[n−1] and [n]th equalizer switch 502[n] is a transistor, for example, a pMOS transistor. However other types of transistors are within scope of the disclosure. For example, each of [n−1]th equalizer switch 502[n−1] and a [n]th equalizer switch 502[n] can be a MOSFET, a nMOS transistor, and a CMOS transistor.

A source of [n−1]th equalizer switch 502[n−1] is connected to [n−1]th bit line LBL[n−1] 508a[n−1]. A drain of [n−1]th equalizer switch 502[n−1] is connected to [n−1]th complementary bit line LBLB[n−1] 508b[n−1]. In example embodiments, [n−1]th equalizer switch 502[n−1] is symmetrical, hence, the source can be selected to be the drain and the drain can be selected to be the source.

In addition, a source of [n]th equalizer switch 502[n] is connected to [n]th bit line LBL[n] 508a[n]. A drain of [n]th equalizer switch 502[n] is connected to [n]th complementary bit line LBLB[n] 508b[n]. In example embodiments, [n]th equalizer switch 502[n] is also symmetrical, hence, the source can be selected to be the drain and the drain can be selected to be the source.

A gate of each of [n−1]th equalizer switch 502[n−1] and [n]th equalizer switch 502[n] is connected to an equalizer driver 504 via equalizer bar EQB terminal 506. Equalizer driver 504 is operative to control a switching of each of [n−1]th equalizer switch 502[n−1] and [n]th equalizer switch 502[n]. For example, equalizer driver 504 charges equalizer bar EQB terminal 506 to a logic high or a logic low. When equalizer bar EQB terminal 506 is charged to a logic high, it switches OFF each of [n−1]th equalizer switch 502[n−1] and [n]th equalizer switch 502[n]. By extension, when equalizer bar EQB terminal 506 is charged to a logic low, it switches ON each of [n−1]th equalizer switch 502[n−1] and [n]th equalizer switch 502[n]. In example examples, equalizer bar EQB terminal 506 is same as is connected to pre-charge bar PCB terminal.

When switched ON, an equalizer switch of the plurality of equalizer switch connects a bit line of the bit line pair with the complementary bit line of the bit line pair thereby accelerating pre-charging of each of the bit line and the complementary bit line of the bit line pair. For example, when switch ON [n−1]th equalizer switch 502[n−1] connects [n−1]th bit line LBL[n−1] 508a[n−1] to [n−1]th complementary bit line LBLB [n−1] 508b[n−1]. By connecting [n−1]th bit line LBL[n−1] 508a[n−1] to [n−1]th complementary bit line LBLB [n−1] 508b[n−1], [n−1]th equalizer switch 502[n−1] equalizes a potential of [n−1]th bit line LBL[n−1] 508a[n−1] with a potential of [n−1]th complementary bit line LBLB[n−1] 508b[n−1]. Similarly, when switch ON [n]th equalizer switch 502[n] connects [n]th bit line LBL[n] 508a[n] to [n]th complementary bit line LBLB[n] 508b[n]. By connecting [n]th bit line LBL[n] 508a[n] to [n]th complementary bit line LBLB[n] 508b[n], [n]th equalizer switch 502[n] equalizes a potential of [n]th bit line LBL[n] 508a[n] with a potential of [n]th complementary bit line LBLB[n] 508b[n].

Figure 6:
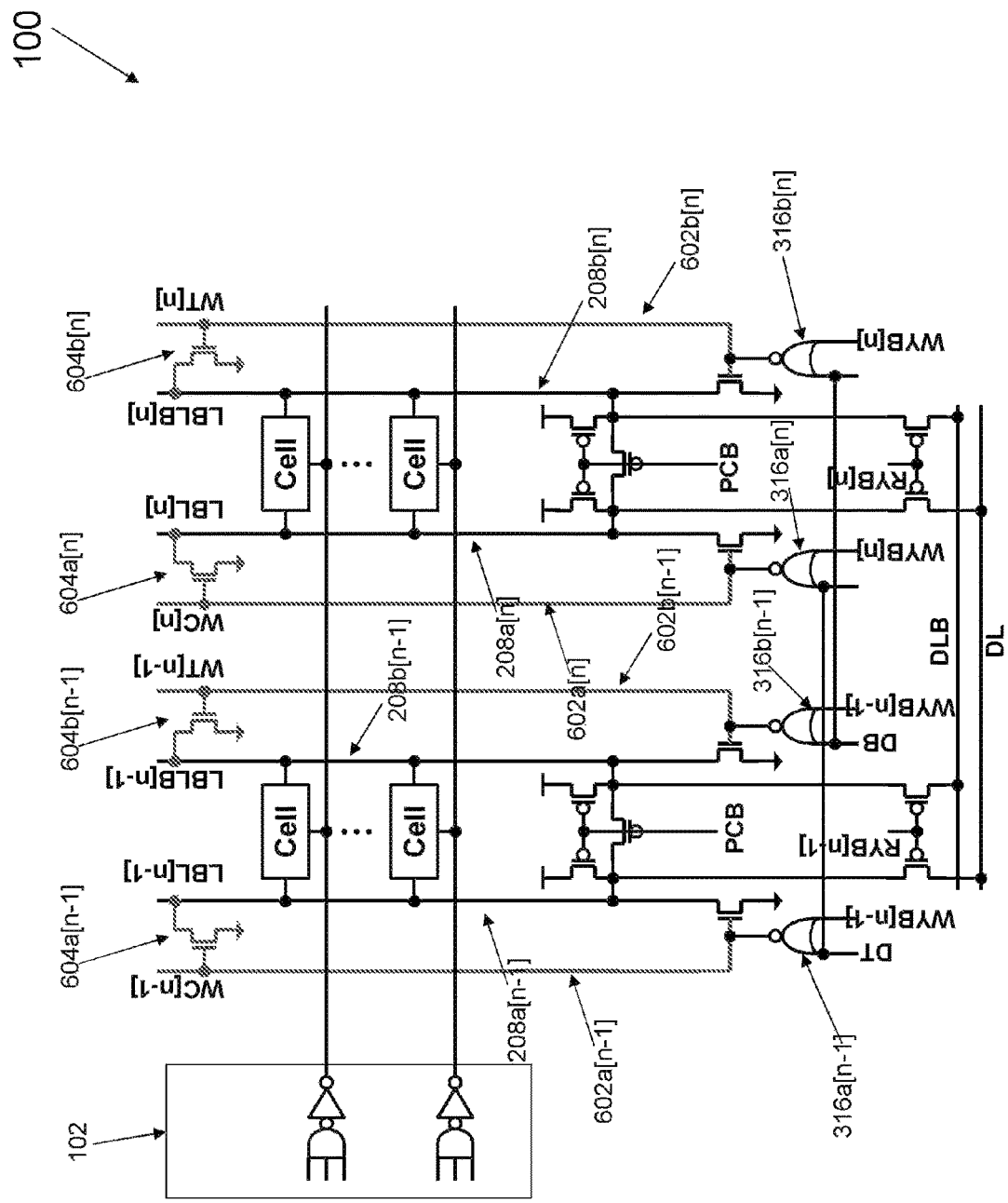
FIG. 6 is a diagram of another example memory device, in accordance with some embodiments.

FIG. 6 is a diagram illustrating memory 100 in which the additional pair of bit lines are directly driven by write select logic circuits. As shown in FIG. 6, [n−1]th bit line LBL[n−1] 208a[n−1] is associated with a [n−1]th write bar WC[n−1] 602a[n−1] and [n−1]th complementary bit line LBLB[n−1] 208b[n−1] is associated with a [n−1]th write true WT[n−1] 602b[n−1]. In example embodiments, [n−1]th write bar WC[n−1] 602a[n−1]) is driven by [n−1]th write select first logic circuit 316a[n−1]. That is, an output of [n−1]th write select first logic circuit 316a[n−1] is connected to [n−1]th write bar WC[n−1] 602a[n−1]). Moreover, [n−1]th write bar WC[n−1] 602a[n−1]) is also connected to a gate of a [n−1]th first connection switch 604a[n−1]. A source of [n−1]th first connection switch 604a[n−1] is connected to [n−1]th bit line LBL[n−1] 208a[n−1] and a drain of [n−1]th first connection switch 604[n−1] is connected to ground.

Similarly, [n−1]th write true WT[n−1] 602b[n−1] is driven by [n−1]th write select second logic circuit 316b[n−1]. That is, an output of [n−1]th write select second logic circuit 316b[n−1] is connected to [n−1]th write true WT[n−1] 602b[n−1]). Moreover, [n−1]th write true WT[n−1] 602b[n−1] is also connected to a gate of a [n−1]th second connection switch 604b[n−1]. A source of [n−1]th second connection switch 604b[n−1] is connected to [n−1]th complementary bit line LBLB[n−1] 208b[n−1] and a drain of [n−1]th second connection switch 604b[n−1] is connected to ground.

In example embodiments, each of [n−1]th first connection switch 604a[n−1] and [n−1]th second connection switch 604a[n−1] is an nMOS transistor. However, other types of transistors, for example, a MOSFET, a pMOS transistor, a CMOS transistor, etc., are within the scope of the disclosure. In addition, each of [n−1]th first connection switch 604a[n−1] and [n−1]th second connection switch 604b[n−1] is symmetrical. That is, a source of each of [n−1]th first connection switch 604a[n−1] and [n−1]th second connection switch 604b[n−1] can be a drain and a drain can be a source.

In a write operation, when [n−1]th write select bit WYB [n−1] is at a logic low, both [n−1]th write bar WC[n−1] 602a[n−1]) and [n−1]th write true WT[n−1] 602b[n−1] are selected. In addition, when both [n−1]th write bar WC[n−1] 602a[n−1]) and [n−1]th write true WT[n−1] 602b[n−1] are at a logic high, both [n−1]th first connection switch 604a[n−1] and [n−1]th second connection switch 604b[n−1] are switched ON. During a write operation, when both [n−1]th write bar WC[n−1] 602a[n−1]) and [n−1]th write true WT[n−1] 602b[n−1] are at a logic low, no data is written. However, when [n−1]th write bar WC[n−1] 602a[n−1]) is at a logic high and [n−1]th write true WT[n−1] 602b[n−1] is at a logic low at bit value of 0 is written. In addition, when

[n−1]th write bar WC[n−1] 602a[n−1]) is at a logic high and [n−1]th write true WT[n−1] 602b[n−1] is at a logic high at bit value of 1 is written.

Continuing with FIG. 6, [n]th bit line LBL[n] 208a[n] is associated with a [n]th write bar WC[n] 602a[n] and [n]th complementary bit line LBLB[n] 208b[n] is associated with a [n]th write true WT[n] 602b[n]. In example embodiments, [n]th write bar WC[n] 602a[n]) is driven by [n]th write select first logic circuit 316a[n]. That is, an output of [n]th write select first logic circuit 316a[n] is connected to [n]th write bar WC[n] 602a[n]). Moreover, [n]th write bar WC[n] 602a[n]) is also connected to a gate of a [n]th first connection switch 604a[n]. A source of [n]th first connection switch 604a[n] is connected to [n]th bit line LBL[n] 208a[n] and a drain of [n]th first connection switch 604[n] is connected to ground.

Similarly, [n]th write true WT[n] 602b[n] is driven by [n]th write select second logic circuit 316b[n]. That is, an output of [n]th write select second logic circuit 316b[n] is connected to [n]th write true WT[n] 602b[n]). Moreover, [n]th write true WT[n] 602b[n] is also connected to a gate of a [n]th second connection switch 604b[n]. A source of [n]th second connection switch 604b[n] is connected to [n]th complementary bit line LBLB[n−1] 208b[n] and a drain of [n]th second connection switch 604b[n] is connected to ground.

In example embodiments, each of [n]th first connection switch 604a[n] and [n]th second connection switch 604b[n] is an nMOS transistor. However, other types of transistors, for example, a MOSFET, a pMOS transistor, a CMOS transistor, etc., are within the scope of the disclosure. In addition, each of [n]th first connection switch 604a[n] and [n]th second connection switch 604b[n] is symmetrical. That is, a source of each of [n]th first connection switch 604a[n] and [n]th second connection switch 604b[n] can be a drain and a drain can be a source.

In a write operation, when [n]th write select bit WYB[n] is at a logic low, both [n]th write bar WC[n] 602a[n]) and [n]th write true WT[n] 602b[n] are selected. In addition, when both [n]th write bar WC[n] 602a[n]) and [n]th write true WT[n] 602b[n] are at a logic high, both [n]th first connection switch 604a[n] and [n]th second connection switch 604b[n] are switched ON. During a write operation, when both [n]th write bar WC[n] 602a[n]) and [n]th write true WT[n] 602b[n] are at a logic low, no data is written. However, when [n]th write bar WC[n] 602a[n]) is at a logic high and [n]th write true WT[n] 602b[n] is at a logic low at bit value of 0 is written. In addition, when [n]th write bar WC[n] 602a[n]) is at a logic high and [n]th write true WT[n] 602b[n] is at a logic high at bit value of 1 is written.

Figure 7:
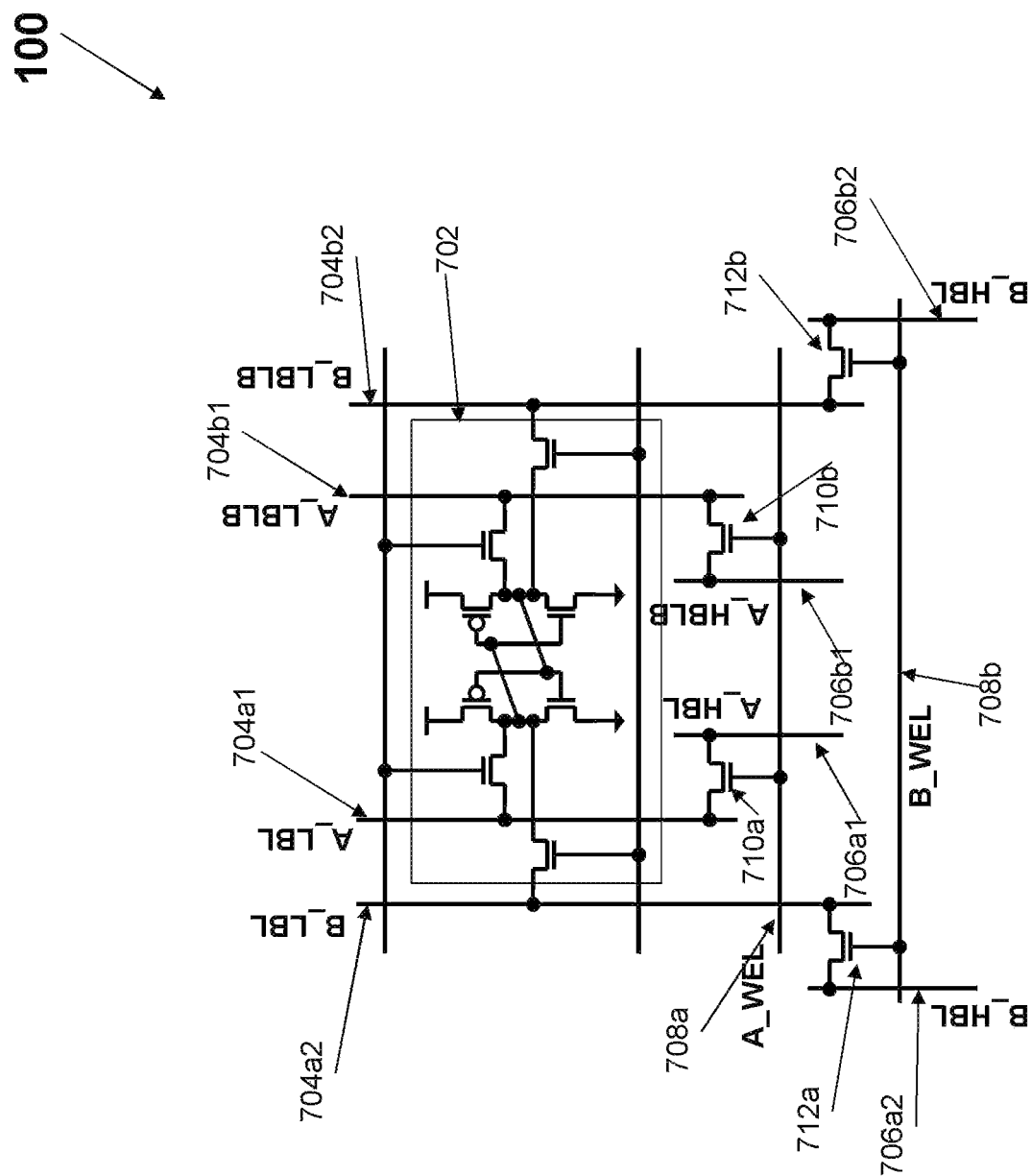
FIG. 7 is a diagram illustrating an example memory device with a dual port cell, in accordance with some embodiments.

In example embodiments, the additional bit line pairs can be provided for memory devices having multi-port cells. FIG. 7 is a diagram illustrating a memory device 700 which includes a dual port cell 702 in accordance with some embodiments. As shown in FIG. 7, dual port cell 702 of memory device 700 includes a first port (that is, port A) and a second port (that is, port B). Memory device 700 further includes a first bit line pair (that is, a first bit line A_LBL 704a1 and a first complementary bit line A_LBLB 704b1), and a second pair of bit line (that is, a second bit line B_LBL 704a2 and a second complementary bit line B_LBLB 704b2). First bit line A_LBL 704a1 and first complementary bit line A_LBLB 704b1 are associated with the port A. In addition, second bit line B_LBL 704a2 and second complementary bit line B_LBLB 704b2 are associated with the port B.

Moreover, memory device 700 includes a first additional bit line pair (that is, a first additional bit line A_HBL 706a1 and a first complementary additional bit line A_HBLB 706b1) and a second additional pair of bit line (that is, a second additional bit line B_HBL 706a2 and a second complementary additional bit line B_HBLB 706b2). Each of the additional of bit line pairs are connectable to a corresponding bit line pair. For example, the first additional bit line pair is connectable to the first bit line pair and the second additional bit line pair is connectable to the second bit line pair. The additional of bit line pairs are connectable to the corresponding bit line pair through a plurality of switches. For example, memory device 700 includes a plurality of switches, that is, a first transistor 710a, a first additional transistor 710b, a second transistor 712a, and a second additional transistor 712b.

As shown in FIG. 7, a source of first transistor 710a is connected to first bit line 704a1 and a drain of first transistor 710a is connected to first additional bit line 706a1. Similarly, a source of first additional transistor 710b is connected to first complementary bit line 704b1 and a drain of first additional transistor 710b is connected to first additional complementary bit line 706b1. A gate of each of first transistor 710a and first additional transistor 710b is connected to a first write enable line A_WEL 708a.

In example embodiments, each of first transistor 710a and first additional transistor 710b is an nMOS transistor. However, other types of transistors, for example, a MOSFET, a pMOS transistor, a CMOS transistor, etc., are within the scope of the disclosure. In addition, each of first transistor 710a and first additional transistor 710b is symmetrical. That is, a source of each of first transistor 710a and first additional transistor 710b can be a drain and a drain can be a source.

In example embodiments, each of first transistor 710a and first additional transistor 710b are switched ON and switched OFF when first write enable line A_WEL 708a is at a logic high and a logic low respectively. Hence, when first write enable line A_WEL 708a is at a logic high, first transistor 710a is switched ON and first bit line 704a1 is connected to first additional bit line 706a1. In addition, when first write enable line A_WEL 708a is at a logic high, first additional transistor 710b is switched ON and first additional bit line 704b1 is connected to first additional complementary bit line 706b1.

When first write enable line A_WEL 708a is at a logic low, first transistor 710a is switched OFF and first bit line 704a1 is not connected to (or disconnected from) first additional bit line 706a1. Moreover, when first write enable line A_WEL 708a is at a logic low, first additional transistor 710b is switched OFF and first additional bit line 704b1 is not connected to (or disconnected from) first additional complementary bit line 706b1. In example embodiments, first write enable line A_WEL 708a is at a logic high during a write operation and first write enable line A_WEL 708a is at a logic low during a read operation.

Continuing with FIG. 7, a source of second transistor 712a is connected to second bit line 704a2 and a drain of second transistor 712a is connected to second additional bit line 706a2. Similarly, a source of second additional transistor 712b is connected to second complementary bit line 704b2 and a drain of second additional transistor 712b is connected to second additional complementary bit line 706b2. A gate of each of second transistor 712a and second additional transistor 712b is connected to a second write enable line B_WEL 708b.

In example embodiments, each of second transistor 712a and second additional transistor 712b is an nMOS transistor.

However, other types of transistors, for example, a MOSFET, a pMOS transistor, a CMOS transistor, etc., are within the scope of the disclosure. In addition, each of second transistor 712a and second additional transistor 712b is symmetrical. That is, a source of each of second transistor 712a and second additional transistor 712b can be a drain and a drain can be a source.

In example embodiments, each of second transistor 712a and second additional transistor 712b are switched ON and switched OFF when second write enable line B_WEL 708b is at a logic high and a logic low respectively. For example, when second write enable line B_WEL 708b is at a logic high, second transistor 712a is switched ON and second bit line 704a2 is connected to second additional bit line 706a2. In addition, when second write enable line B_WEL 708B is at a logic high, second additional transistor 712b is switched ON and second additional bit line 704b2 is connected to second additional complementary bit line 706b2.

However, when second write enable line B_WEL 708b is at a logic low, second transistor 712a is switched OFF and second bit line 704a2 is not connected to (or disconnected from) second additional bit line 706a2. Moreover, when second write enable line B_WEL 708b is at a logic low, second additional transistor 712b is switched OFF and second additional bit line 704b2 is not connected to (or disconnected from) second additional complementary bit line 706b2. In example embodiments, second write enable line B_WEL 708b is at a logic high during a write operation and second write enable line B_WEL 708b is at a logic low during a read operation. Hence, the additional bit line pairs are connected to corresponding existing bit line pairs during a write operation.

Figure 8:
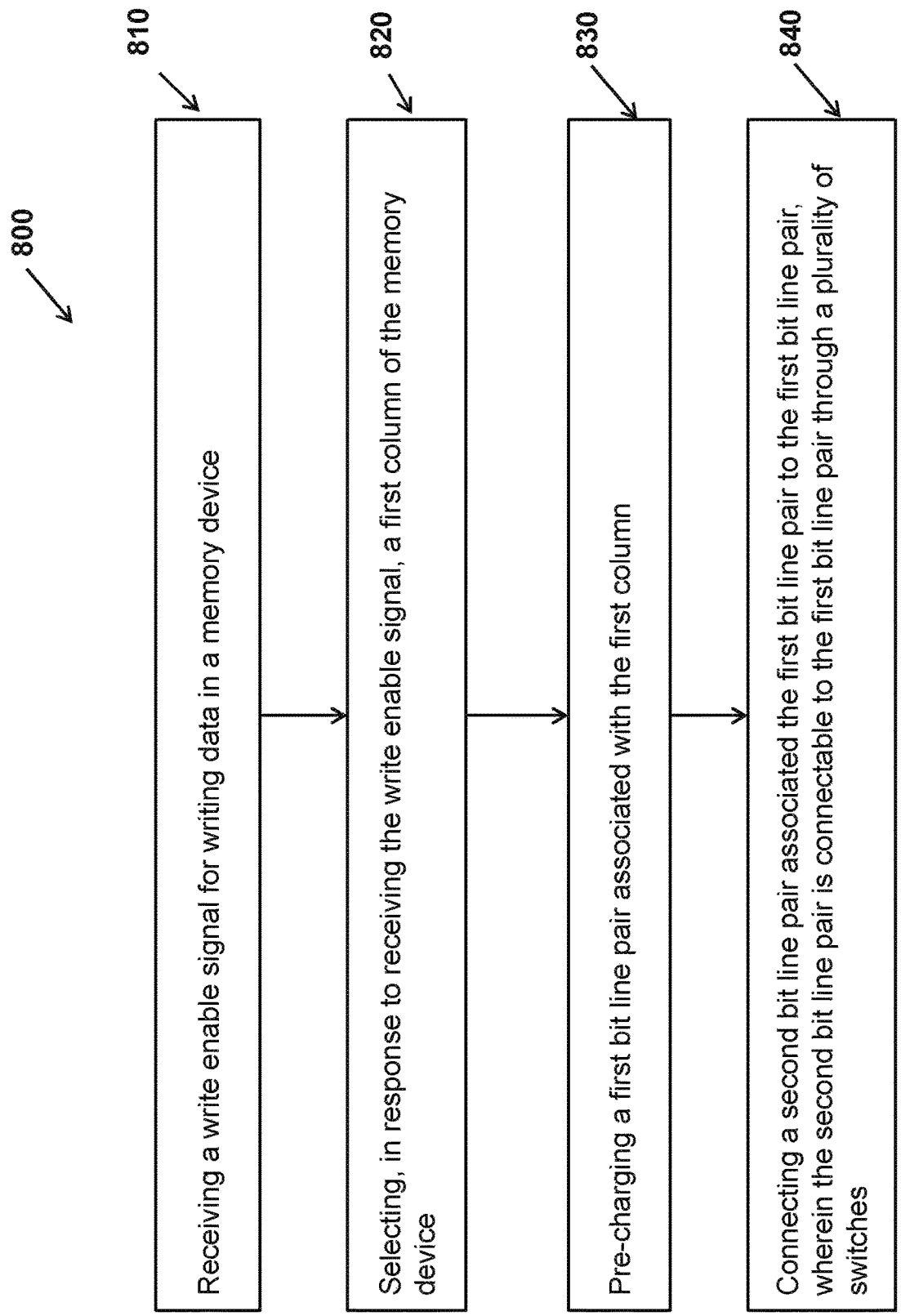
FIG. 8 is a flow diagram illustrating an example method for operating a memory device, in accordance with some embodiments.

FIG. 8 illustrates steps of a method 800 for operating a memory device. The steps of method 800 may be executed to operate memory devices discussed with reference to FIGS. 1-7 of the disclosure. In example embodiments, the steps of method 800 may be performed using logic devices and formed elements. In addition, the steps of method 800 can also be performed using a processor and a memory. For example, the steps of method 800 are stored as instructions on a computer readable medium which when executed by the processor configures the processor to perform the steps of method 800. The computer readable medium can be a non-transitory computer readable medium.

At block 810 of method 800, a write enable signal is received. The write enable signal is received for writing data in memory device 100. Memory device 100 includes a plurality of memory cells arranged in a matrix of a plurality of rows and a plurality of columns. Each of the plurality of columns include a first plurality of memory cells of the plurality of memory cells, and each of the plurality of rows includes a second plurality of memory cells of the plurality of memory cells.

At block 820 of method 800, a first column of the memory device 100 is selected in response to receiving the write enable signal. For example, [n−1]th column 204 of memory device 100 is selected in response to the write enable signal. In other examples, [n]th column 206 of memory device 100 is selected in response to the write enable signal.

At block 830 of method 800, a first bit line pair associated with the first column is pre-charged. For example, if [n−1]th column 204 is selected, then [n−1]th bit line LBL[n−1] 208a[n−1] and [n−1]th complementary bit line LBLB[n−1] 208b[n−1] are pre-charged to a pre-determined potential. If [n]th column 206 is selected, then [n]th bit line LBL[n] 208a[n] and [n]th complementary bit line LBLB[n] 208b[n] are pre-charged to a pre-determined potential.

At block 840 of method 800, a second bit line pair associated the first bit line pair are connected to the first bit line pair. The second bit line pair is connectable to the first bit line pair through a plurality of switches. For example, [n−1]th additional bit line HBL[n−1] 210a[n−1] and [n−1]th additional complementary bit line HBLB[n−1] 210b[n−1] are connected to [n−1]th bit line LBL[n−1] 208a[n−1] and [n−1]th complementary bit line LBLB[n−1] 208b[n−1] respectively. For example, [n−1]th additional bit line HBL[n−1] 210a[n−1] is connected to [n−1]th bit line LBL[n−1] 208a[n−1] through [n−1]th first switch 212a0[n−1] and [n−1]th second switch 212a1[n−1]. Moreover, [n−1]th additional complementary bit line HBLB[n−1] 210b[n−1] is connected to [n−1]th complementary bit line LBLB [n−1] 208b[n−1] through [n−1]th first complementary switch 212b0[n−1] and [n−1]th second complementary switch 212b1[n−1].

In accordance with example embodiments, a memory device comprises: a plurality of memory cells arranged in a matrix of a plurality of rows and a plurality of columns, wherein a first column of the plurality of columns of the matrix comprises: a first plurality of memory cells of the plurality of memory cells, a first pair of bit lines connected to each of the first plurality of bit cells, and a second pair of bit lines connectable to the first pair of bit lines through a plurality of switches.

In accordance with example embodiments, a memory device comprises: a plurality of memory cells arranged in a matrix of a plurality of rows and a plurality of columns, wherein each of the plurality of columns comprises a first plurality of memory cells of the plurality of memory cells, and wherein each of the plurality of rows comprises a second plurality of memory cells of the plurality of memory cells; a plurality of first bit line pairs, wherein each first bit line pair of the plurality of first bit line pairs is connected to the first plurality of memory cells of a column of the plurality of columns; and a plurality of second bit line pairs, wherein each second bit line pair of the plurality of second bit line pairs is associated with a first bit line pair of the first plurality of bit line pairs, and wherein the each second bit line pair is connectable to the associated first bit line pair through a plurality of switches.

In accordance with example embodiments a method for operating a memory device comprises: receiving a write enable signal for writing data in a memory device; selecting, in response to receiving the write enable signal, a first column of the memory device; pre-charging a first bit line pair associated with the first column; and connecting a second bit line pair associated the first bit line pair to the first bit line pair, wherein the second bit line pair is connectable to the first bit line pair through a plurality of switches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising a plurality of columns, wherein each column of the plurality of columns of the memory device comprises:
   a first plurality of memory cells;
   a first pair of bit lines connected to each of the first plurality of bit cells; and
   a second pair of bit lines connectable to the first pair of bit lines through a plurality of pair of switches, wherein a first pair of switches of the plurality of pair of switches is connected between the first pair of bit lines and the second pair of bit lines, wherein a second pair of switches of the plurality of pair of switches is connected between the first pair of bit lines and the second pair of bit lines after a first predetermined number of rows of a plurality of rows of a cell array of the memory device from the first pair of switches, wherein the plurality of pair of switches remain switched off thereby disconnecting the second pair of bit lines from the first pair of bit lines during a read operation in the memory device, and wherein the plurality of pair of switches are switched on thereby connecting the second pair of bit lines to the first pair of bit lines during a write operation in the memory device through the plurality of pair of switches.

2. The memory device of claim 1, wherein the first pair of bit lines comprises a first bit line and a first complementary bit line, wherein the second pair of bit lines comprises a second bit line and a second complementary bit line, wherein the first bit line is connectable to the second bit line, and wherein the first complementary bit line is connectable to the second complementary bit line.

3. The memory device of claim 1, wherein each pair of switches in a row are connected to a write enable line and switched on through the write enable line.

4. The memory device of claim 1, wherein the first pair of bit lines are formed in a first metal layer and the second pair of bit lines are formed in a second metal layer, wherein the second metal layer is different from the first metal layer.

5. The memory device of claim 1, wherein the first pair of bit lines are formed in a first metal layer and the second pair of bit lines are formed in a second metal layer, wherein the second metal layer is a higher metal layer than the first metal layer.

6. The memory device of claim 5, wherein the second metal layer is at least two layer higher than the first metal layer.

7. The memory device of claim 1, further comprising an equalizer switch, wherein the first pair of bit lines comprises a first bit line and a first complementary bit line, and wherein the equalizer switch selectively connects the first bit line with the first complementary bit line.

8. The memory device of claim 1, wherein the first pair of bit lines comprises a first bit line and a first complementary bit line, and wherein the first bit line is selectively connectable with the first complementary bit line with an equalizer switch, and wherein the equalizer switch is provided for every predetermined number of rows.

9. A memory device comprising:
   a plurality of memory cells arranged in a matrix of a plurality of rows and a plurality of columns in an array, wherein each of the plurality of columns comprises a first plurality of memory cells of the plurality of memory cells;
   a plurality of first bit line pairs, wherein each first bit line pair of the plurality of first bit line pairs is connected to the first plurality of memory cells of a column of the plurality of columns; and
   a plurality of second bit line pairs, wherein each of a second bit line pair of the plurality of second bit line pairs is associated with a first bit line pair of the plurality of first bit line pairs, wherein the each second bit line pair is connectable to an associated first bit line pair through a plurality of pair of switches, wherein a first pair of switches of the plurality of pair of switches is connected between the first pair of bit lines and the second pair of bit lines, wherein a second pair of switches of the plurality of pair of switches is connected between the first pair of bit lines and the second pair of bit lines after a first predetermined number of rows of a plurality of rows of a cell array of the memory device from the first pair of switches, wherein the plurality of pair of switches remain switched off thereby disconnecting the second pair of bit lines from the first pair of bit lines during a read operation in the memory device, and wherein the plurality of pair of switches are switched on thereby connecting the second pair of bit lines to the first pair of bit lines during a write operation in the memory device through the plurality of pair of switches.

10. The memory device of claim 9, further comprising a negative voltage generator, wherein the negative voltage generator, when enabled, is operative to provide a negative voltage to the plurality of first bit line pairs and the plurality of second bit line pairs.

11. The memory device of claim 9, wherein the plurality of first bit line pairs are formed in a first metal layer and the plurality of second bit line pairs are formed in a second metal layer, wherein the second metal layer is a higher metal layer than the first metal layer.

12. The memory device of claim 11, wherein the second metal layer is at least two layer higher than the first metal layer.

13. The memory device of claim 9, further comprising an equalizer switch, wherein the first bit line pair comprises a first bit line and a first complementary bit line, and wherein the equalizer switch selectively connects the first bit line with the first complementary bit line.

14. The memory device of claim 13, wherein the equalizer switch is provided for every predetermined number of rows.

15. The memory device of claim 9, wherein each pair of switches in a row are connected to a write enable line and switched on through the write enable line.

16. A method for operating a memory device, the method comprising:
   receiving a write enable signal for writing data in a memory device;
   selecting, in response to receiving the write enable signal, a first column of the memory device;
   pre-charging a first bit line pair associated with the first column; and
   connecting a second bit line pair associated the first bit line pair to the first bit line pair, wherein the second bit line pair is connectable to the first bit line pair through a plurality of pair of switches, wherein a first pair of switches of the plurality of pair of switches is connected between the first pair of bit lines and the second pair of bit lines, wherein a second pair of switches of the plurality of pair of switches is connected between the first pair of bit lines and the second pair of bit lines after a first predetermined number of rows of a plurality of rows of a cell array of the memory device from the first pair of switches, wherein the plurality of pair of switches remain switched off thereby disconnecting the second pair of bit lines from the first pair of bit lines during a read operation in the memory device, and wherein the plurality of pair of switches are switched on thereby connecting the second pair of bit lines to the first pair of bit lines during a write operation in the memory device through the plurality of pair of switches.

17. The method of claim 16, wherein the first bit line pair is formed in a first metal layer and the second bit line pair is formed in a second metal layer, wherein the second metal layer is a higher metal layer than the first metal layer.

18. The method of claim 17, wherein the second metal layer is at least two layer higher than the first metal layer.

19. The method of claim 16, wherein the memory device further comprising an equalizer switch, wherein the first bit line pair comprises a first bit line and a first complementary bit line, and wherein the equalizer switch selectively connects the first bit line with the first complementary bit line.

20. The method of claim 16, wherein each pair of switches in a row are connected to a write enable line and switched on through the write enable line.

\* \* \* \* \*